United States Patent
Yu et al.

(10) Patent No.: US 11,957,024 B2
(45) Date of Patent: Apr. 9, 2024

(54) ORGANIC LIGHT EMITTING DISPLAY PANEL AND ORGANIC LIGHT EMITTING DISPLAY DEVICE

(71) Applicant: WUHAN TIANMA MICRO-ELECTRONICS CO., LTD., Wuhan (CN)

(72) Inventors: Chujie Yu, Wuhan (CN); Jiazhu Zhu, Wuhan (CN); Shanfu Yuan, Wuhan (CN); Tao Peng, Wuhan (CN); Ruiyuan Zhou, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 820 days.

(21) Appl. No.: 17/035,776

(22) Filed: Sep. 29, 2020

(65) Prior Publication Data

US 2021/0013270 A1  Jan. 14, 2021

Related U.S. Application Data

(63) Continuation-in-part of application No. 16/147,580, filed on Sep. 29, 2018, now Pat. No. 10,826,015.

(30) Foreign Application Priority Data

Jun. 20, 2018  (CN) .......................... 201810639409.6

(51) Int. Cl.
*H10K 59/12* (2023.01)
*G06F 3/041* (2006.01)
(Continued)

(52) U.S. Cl.
CPC ........... *H10K 59/40* (2023.02); *G06F 3/0412* (2013.01); *G06F 3/044* (2013.01); *H10K 50/844* (2023.02);
(Continued)

(58) Field of Classification Search
CPC ....... H10K 50/00–88; H10K 59/00–95; H10K 65/00; H10K 85/00–791;
(Continued)

(56) References Cited

U.S. PATENT DOCUMENTS

| 2018/0324926 A1* | 11/2018 | Fleissner | ................ H10K 59/00 |
| 2019/0294281 A1* | 9/2019 | Kim | ................... H10K 50/8426 |
| 2020/0133052 A1* | 4/2020 | Gu | ......................... G02F 1/1339 |

* cited by examiner

*Primary Examiner* — Eric A. Ward
*Assistant Examiner* — Nora Taylor Nix
(74) *Attorney, Agent, or Firm* — KILPATRICK TOWNSEND & STOCKTON LLP

(57) ABSTRACT

An OLED panel includes a display area and a non-display area around the display area; a substrate, a driving device layer and a light emitting device layer arranged in the display area, an encapsulation layer covering the light emitting device layer; and a touch layer located on a side of the encapsulation layer facing away from the substrate, the touch layer comprising a touch electrode and a touch wire. The non-display area includes an electrostatic discharge portion, the electrostatic discharge portion is made of a conductive material and is located on a side of the encapsulation layer facing away from the substrate. The non-display area includes a blocking portion, the blocking portion is arranged around the display area, and is located between the substrate and the encapsulation layer. The electrostatic discharge portion is located on a side of the touch wire facing away from the display area.

18 Claims, 17 Drawing Sheets

(51) Int. Cl.
*G06F 3/044* (2006.01)
*H10K 50/844* (2023.01)
*H10K 50/86* (2023.01)
*H10K 59/40* (2023.01)
*G09G 3/3225* (2016.01)

(52) U.S. Cl.
CPC ............. *H10K 50/86* (2023.02); *H10K 59/12* (2023.02); *G06F 2203/04111* (2013.01); *G09G 3/3225* (2013.01)

(58) Field of Classification Search
CPC .......... H10K 2101/00–90; H10K 71/70; H01L 23/60; H01L 22/34; H01L 33/00–648; H01L 27/15–156; H01L 2933/00–0091; H01L 27/1214–1296; G09G 3/006; G09G 3/3208; G09G 2330/12; G02F 1/1309; G02F 1/136204; G02F 1/13–13793; B32B 2457/202; H05K 2201/10136
See application file for complete search history.

ORGANIC LIGHT EMITTING DISPLAY PANEL AND ORGANIC LIGHT EMITTING DISPLAY DEVICE

CROSS REFERENCE TO RELATED APPLICATION

The present application is a continuation-in-part of U.S. patent application Ser. No. 16/147,580, titled "ORGANIC LIGHT EMITTING DISPLAY PANEL AND ORGANIC LIGHT EMITTING DISPLAY DEVICE", filed on Sep. 29, 2018 with the USPTO, which claims the priority to Chinese Patent Application No. 201810639409.6, titled "ORGANIC LIGHT EMITTING DISPLAY PANEL AND ORGANIC LIGHT EMITTING DISPLAY DEVICE", filed on Jun. 20, 2018 with the State Intellectual Property Office of the PRC, the entire of which are incorporated herein by reference in their entities.

FIELD

The present disclosure relates to the field of display, and particularly to an organic light emitting display panel and an organic light emitting display device.

BACKGROUND

In human sensory organs, eyes accept most information. In production and life, people need to use increasingly abundant visual information. Therefore, the display technique plays a very important role in the current human society. Since the emergence of the display technique, the technique develops rapidly. Cathode ray tube technology (CRT), plasma display panel (PDP), liquid crystal display (LCD), even the latest organic light emitting display (OLED) and micro light emitting diode (micro LED) display technique emerge successively.

With the development of the society and the increasing requirement for material life of human, the current display technique develops quickly towards the directions of narrow bezel, high contrast, high resolution, full color display, low power consumption, high reliability, long service life, and being thin and light. The research of OLED display technique constantly improves.

The OLED panel can be applied in multiple fields, such as a rollable display device, a flexible wearable device, and a foldable display device. How to continuously improve the reliability and reduce the cost for the OLED panel is a problem to be solved in the display industry.

SUMMARY

In view of above, an OLED panel and an OLED device are provided according to embodiments of the present disclosure.

An OLED panel is provided according to the embodiments of the present disclosure, which includes: a display area and a non-display area around the display area; a substrate; a driving device layer and a light emitting device layer arranged above the substrate, where the driving device layer and the light emitting device layer are located in the display area, the driving device layer includes multiple thin film transistors, the light emitting device layer includes multiple organic light emitting diodes; an encapsulation layer covering the light emitting device layer; and a touch layer located on a side of the encapsulation layer facing away from the substrate, the touch layer comprising a touch electrode and a touch wire. The non-display area includes an electrostatic discharge portion, the electrostatic discharge portion is made of a conductive material and is located on a side of the encapsulation layer facing away from the substrate. The non-display area includes a blocking portion, the blocking portion is arranged around the display area, and is located between the substrate and the encapsulation layer. The electrostatic discharge portion is located on a side of the touch wire facing away from the display area.

An OLED device is further provided according to the embodiments of the present disclosure, which includes the OLED panel according to the embodiments of the present disclosure.

Compared with the conventional technology, the OLED panel and the OLED device provided according to the embodiments of the present disclosure have at least one of the following beneficial effects.

The electrostatic discharge portion can discharge static electricity from outside of the OLED panel. The electrostatic discharge portion is arranged in the non-display area and many circuit structures and electronic elements are arranged in the display area, thereby preventing interference on the circuit structures and electronic elements in the display area from the electrostatic discharge portion.

The electrostatic discharge portion is located on the side of the encapsulation layer facing away from the substrate. In the non-display area, some signal wires or driving circuits are usually arranged between the encapsulation layer and the substrate, and the side of the encapsulation layer facing away from the substrate generally has a simple structure. In order not to increase a width of the non-display area, the electrostatic discharge portion is arranged on the side of the encapsulation layer facing away from the substrate, which is beneficial to achieve a narrow frame of the OLED panel.

The electrostatic discharge portion is made of the metal material or the transparent conductive thin film. The metal material or the transparent conductive thin film is a material commonly used in the OLED panel. Since a manufacturing process of the transparent conductive thin film is relatively mature, a process difficulty of manufacturing the electrostatic discharge portion can be reduced, and a manufacturing cost of the OLED panel is reduced.

BRIEF DESCRIPTION OF THE DRAWINGS

Drawings incorporated in the specification and constituting a part of the specification illustrate the embodiments of the present disclosure, and are used together with its description to explain the principle of the present disclosure.

DETAILED DESCRIPTION OF THE EMBODIMENTS

Figure 1:
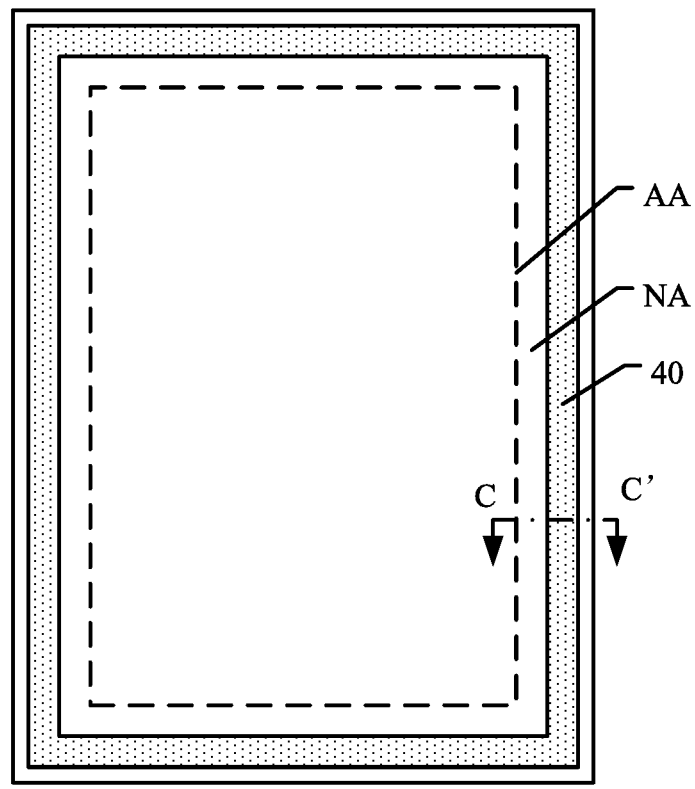
FIG. 1 is a schematic view showing a planar structure of an OLED panel according to an embodiment of the present disclosure.

Various exemplary embodiments of the present disclosure are described in detail in conjunction with the drawings. It should be noted that unless otherwise specified, the relative arrangement of components and steps, numeric expressions, and numeric values illustrated in the embodiments are not intended to limit the scope of the present disclosure.

Description for the at least one exemplary embodiment in the following is merely illustrative and is not intended to limit the present disclosure and its application or use.

Any value in the examples illustrated and discussed here should be interpreted as exemplary rather than limitation. Therefore, different values may be used in other examples of the exemplary embodiments.

It should be noted that similar labels and letters in the following drawings represent similar items. Therefore, once an item is defined in one drawing, the item is not required to be further discussed in following drawings.

As illustrated in FIGS. 1-4, an OLED panel is provided according to an embodiment of the present disclosure. The OLED panel includes: a display area AA, and a non-display area NA around the display area; a substrate 00; a driving device layer 10 and a light emitting device layer 20 arranged above the substrate 00, where the driving device layer 10 and the light emitting device layer 20 are located in the display area AA, the driving device layer 10 includes multiple thin film transistors 11, the light emitting device layer 20 includes multiple organic light emitting diodes 21; and an encapsulation layer 30 covering the light emitting device layer 20. The non-display area NA includes an electrostatic discharge portion 40. The electrostatic discharge portion 40 is made of a conductive material and is located on a side of the encapsulation layer 30 facing away from the substrate 00. The non-display area NA includes at least one blocking portion 50. The blocking portion 50 is arranged around the display area AA, and is located between the substrate 00 and the encapsulation layer 30.

In the OLED panel according to the embodiment of the present disclosure, a buffer layer bf may be arranged between the substrate 00 and the driving device layer 10.

Figure 2:
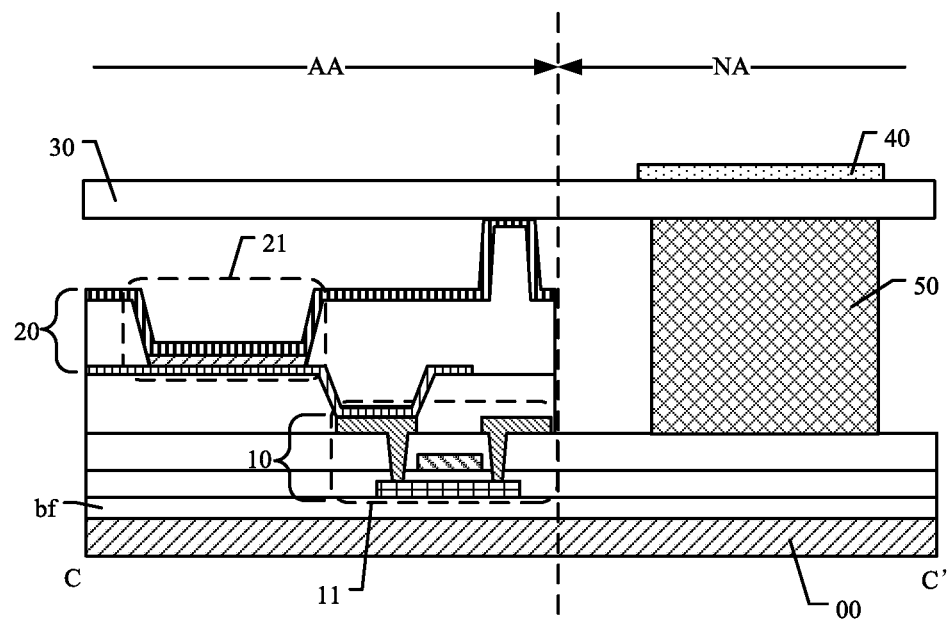
FIG. 2 is a schematic view showing a sectional structure of the OLED panel along a line CC' in FIG. 1.
Figure 4:
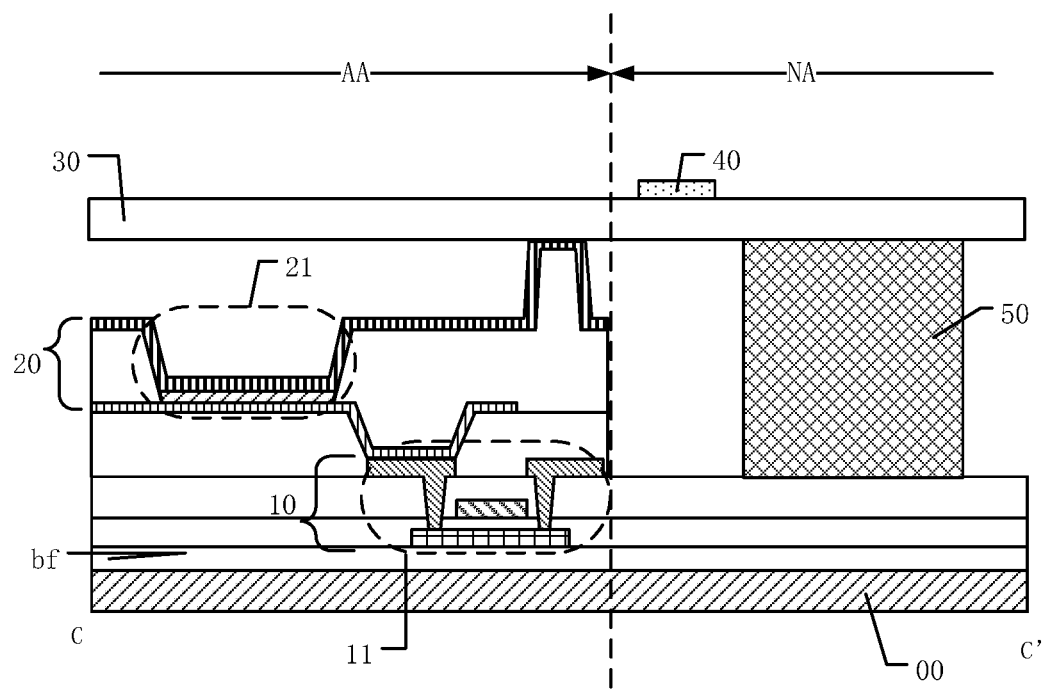
FIG. 4 is a schematic view showing a sectional structure of the OLED panel along a line CC' in FIG. 3.

Circuit structures, such as driving circuits and signal lines, are arranged on the driving device layer 10. For example, the driving device layer 10 includes multiple thin film transistors 11. The thin film transistor 11 includes a gate, an active layer, a source, and a drain. FIGS. 2 and 4 only illustrate one thin film transistor 11 to describe a film structure of the driving device layer 10. It should be understood that the display area AA includes multiple thin film transistors 11.

The OLED panel is a self-luminous display panel. The light emitting device layer 20 includes a light emitting element. In one embodiment, the light emitting element is an organic light emitting diode (OLED) 21. The OLED 21 includes an anode, a cathode, and a luminescent material arranged between the anode and the cathode. FIGS. 2 and 4 only illustrate one OLED 21 to describe a film structure of the light emitting device layer 20. It should be understood that the display area AA includes multiple OLEDs 21.

The encapsulation layer 30 has a function of isolating air. In one embodiment, the encapsulation layer 30 can isolate water vapor, oxygen, and impurities in air to prevent the OLED panel from being corroded and damaged. The encapsulation layer 30 may be hard or flexible. FIGS. 2 and 4 only show that the encapsulation layer 30 is a hard cover plate, for example.

The blocking portion 50 is arranged between the substrate 00 and the encapsulation layer 30 to prevent air from entering into inside of the OLED panel from a lateral surface of the OLED panel. The blocking portion 50 can isolate water vapor, oxygen, and impurities in air to prevent the OLED display panel from being corroded and damaged. The blocking portion 50 is arranged around the display area AA. In one embodiment, the blocking portion 50 is a closed loop. The number of the blocking portions 50 may be one, two, or more to enhance the function of isolation.

The OLED panel provided in the embodiment of the present disclosure includes the electrostatic discharge portion 40. The electrostatic discharge portion 40 can discharge static electricity from outside of the OLED panel. The electrostatic discharge portion 40 is arranged in the non-display area NA and many circuit structures and electronic elements are arranged in the display area AA, thereby preventing interference on the circuit structures and electronic elements in the display area AA from the electrostatic discharge portion 40.

The electrostatic discharge portion 40 is located on the side of the encapsulation layer 30 facing away from the substrate 00. In the non-display area NA, some signal lines or driving circuits are usually arranged between the encapsulation layer 30 and the substrate 00, and the side of the encapsulation layer 30 facing away from the substrate 00 generally has a simple structure. In order not to increase a width of the non-display area NA, the electrostatic discharge portion 40 is arranged on the side of the encapsulation layer 30 facing away from the substrate 00, which is beneficial to achieve a narrow frame of the OLED panel.

In the present application, the electrostatic discharge portion 40 is implemented in two ways.

As shown in FIGS. 1 and 2, in the first implementation way of the electrostatic discharge portion 40, the electrostatic discharge portion 40 is made of the transparent conductive thin film. The transparent conductive thin film is a material commonly used in the OLED panel. Since a manufacturing process of the transparent conductive thin film is relatively mature, a process difficulty of manufacturing the electrostatic discharge portion 40 can be reduced, and a manufacturing cost of the OLED panel is reduced.

In one embodiment, the transparent conductive thin film may be made of at least one of indium oxide, zinc oxide, tin oxide and gallium oxide. For example, the electrostatic discharge portion 40 may be made of indium tin oxide (ITO).

In the direction perpendicular to the substrate 00, the transparent electrostatic discharge portion 40 at least partially overlaps with the blocking portion 50. When the external static electricity enters the OLED panel, the static electricity passes the electrostatic discharge portion 40 arranged in the non-display area NA. The electrostatic discharge portion 40 discharges the static electricity. The static electricity cannot pass the encapsulation layer 30 and the blocking portion 50 to reach other film structures of the OLED panel, thereby preventing the external static electricity from damaging the blocking portion 50. Therefore, a failure of the blocking portion 50 is prevented and a reliability of the OLED panel is improved.

Figure 3:
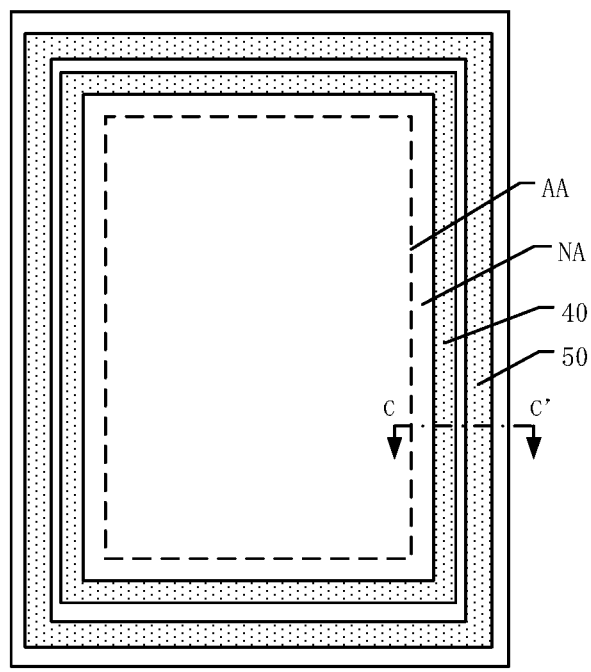
FIG. 3 is a schematic view showing a planar structure of an OLED panel according to an embodiment of the present disclosure.

As shown in FIGS. 3-4, in the second implementation way of the electrostatic discharge portion 40, the electrostatic discharge portion 40 is made of a metal material. The metal material has a good extensibility, and is broken with a low probability. The metal material is a material commonly used in the OLED panel. Since a manufacturing process of the metal material is relatively mature, a process difficulty of manufacturing the electrostatic discharge portion 40 can be reduced, and a manufacturing cost of the OLED panel is reduced.

In one embodiment, the metal electrostatic discharge portion may be made of at least one of for example gold, silver, aluminum, copper, iron, platinum, titanium.

In the direction perpendicular to the substrate 00, the metal electrostatic discharge portion 40 does not overlap with the blocking portion 50, or partially overlaps with the blocking portion 50. For example, the electrostatic discharge portion 40 is located between the light emitting device layer 20 and the blocking portion 50. When the external static electricity enters the OLED panel, the static electricity passes the electrostatic discharge portion 40 arranged in the non-display area NA. The electrostatic discharge portion 40 discharges the static electricity. The static electricity cannot pass the encapsulation layer 30 to reach other film structures of the OLED panel, thereby preventing the external static electricity from damaging the blocking portion 50 and the light emitting device layer 20. Therefore, a reliability of the OLED panel is improved.

FIGS. 1 and 3 only show that the electrostatic release portion 40 is a closed loop, and is arranged around the display area AA, for example. In one embodiment, the electrostatic discharge portion 40 may be a non-closed semi-loop or have other shapes, which is not limited in the embodiment of the present disclosure.

In some embodiments, as illustrated in FIGS. 5-8, the OLED panel further includes a touch layer T located on the side of the encapsulation layer 30 facing away from the substrate 00. The touch layer T includes a touch electrode TP and a touch wire TL.

In the embodiment, the OLED panel has a touch function. The touch layer T is configured to realize the touch function. For example, the touch layer T may detect information of a touch location. The touch layer T includes the touch electrode TP and the touch wire TL. The touch electrode TP and the touch wire TL are electrically connected. The touch wire transmits an electrical signal for the touch electrode TP.

The touch layer T is arranged on the side of the encapsulation layer 30 facing away from the substrate 00, and the touch layer T is far away from the driving device layer 10 and the light emitting device layer 20, thereby preventing the electrical signal of the touch layer T from interfering with the driving device layer 10 and the light emitting device layer 20

In the embodiment, the touch layer T may be self-capacitive or mutual-capacitive, which is not limited in the embodiment. In addition, the shape and the size of the touch electrode, and an extension direction of the touch wire TL are not limited in the embodiment. In an embodiment, the first implementation way of the transparent electrostatic discharge portion 40 is applied to an OLED panel with a self-capacitive touch layer. The second implementation way of the metal electrostatic discharge portion 40 is applied to an OLED panel with a mutual-capacitive touch layer.

Figure 5:
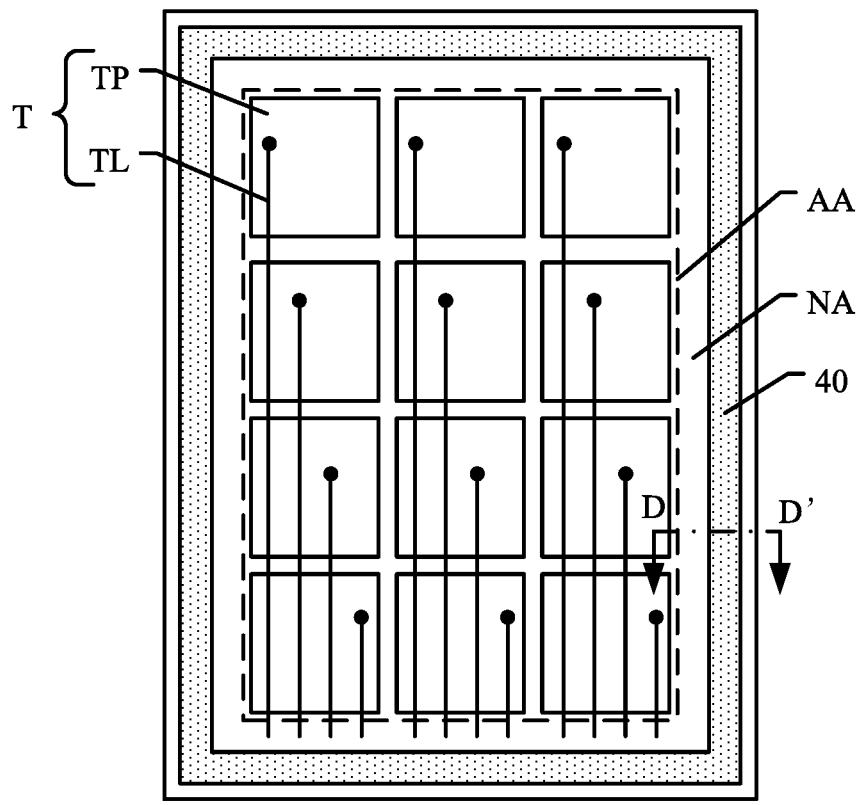
FIG. 5 is a schematic view showing a planar structure of an OLED panel according to an embodiment of the present disclosure.
Figure 6:
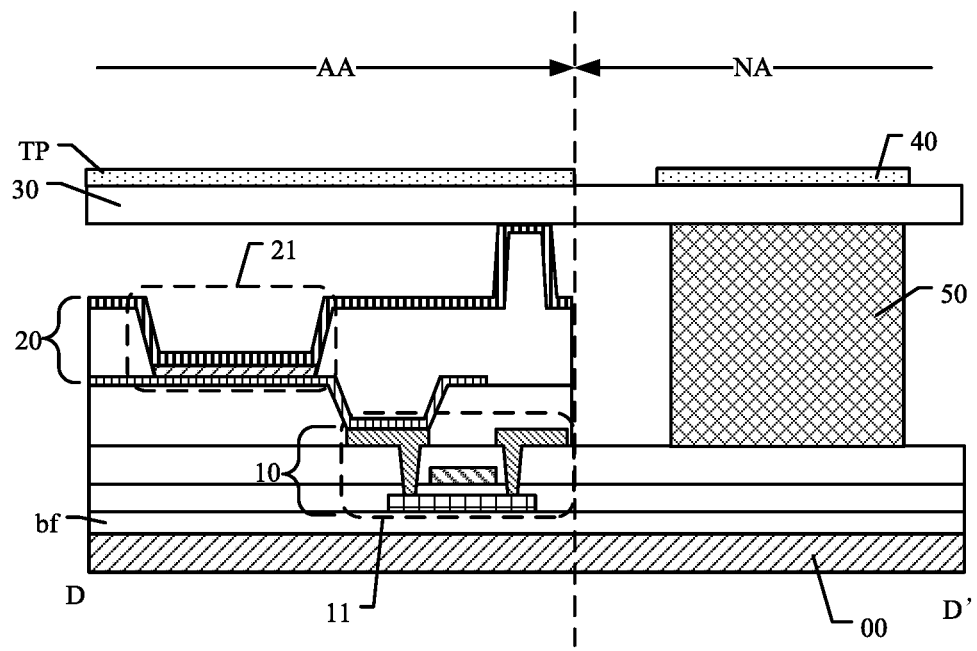
FIG. 6 is a schematic view showing a sectional structure of the OLED panel along a line DD' in FIG. 5.

As shown in FIGS. 5-6, in the first implementation way of the electrostatic discharge portion 40, the electrostatic discharge portion 40 is made of transparent material such as transparent conductive thin film and the touch electrode TP is also made of transparent material such as transparent conductive thin film. Therefore, the electrostatic discharge portion 40 may contain the same material and arranged on the same layer with the touch electrode TP. In the direction perpendicular to the substrate 00, the electrostatic discharge portion 40 overlaps with the blocking portion 50.

Figure 7:
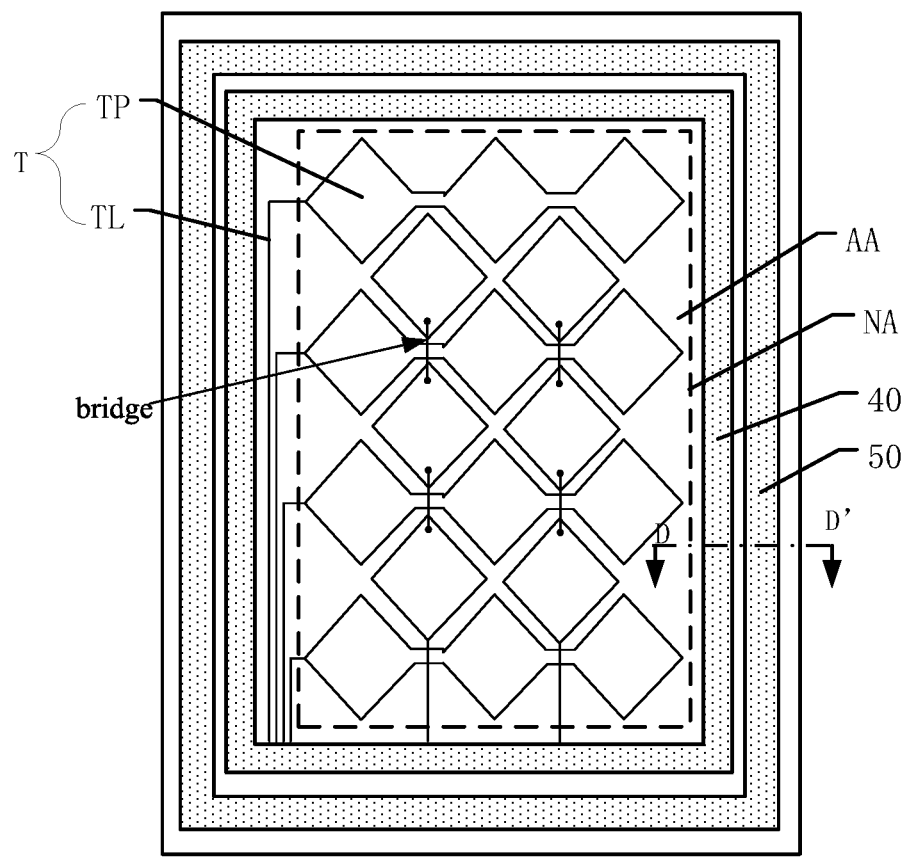
FIG. 7 is a schematic view showing a planar structure of an OLED panel according to an embodiment of the present disclosure.
Figure 8:
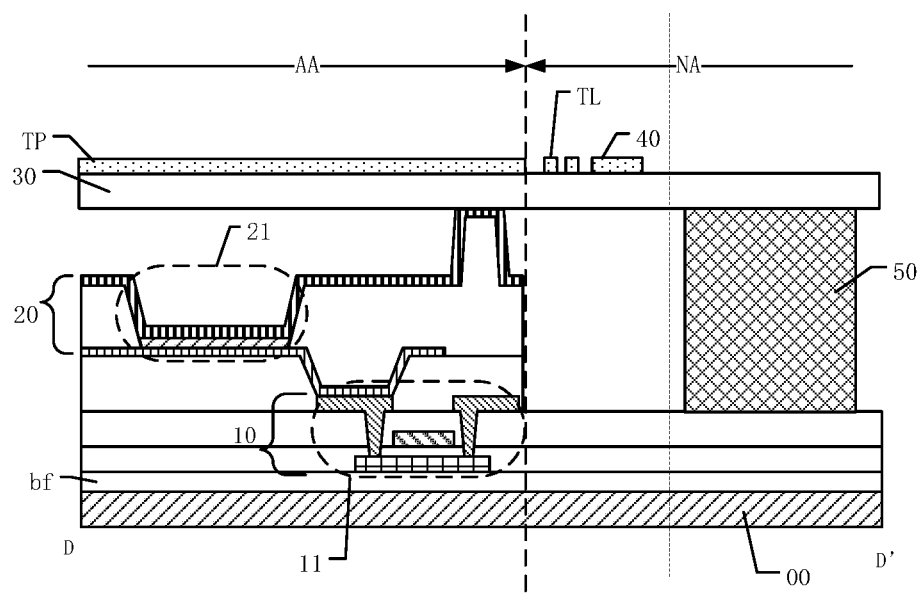
FIG. 8 is a schematic view showing a sectional structure of the OLED panel along a line DD' in FIG. 7.

As shown in FIGS. 7-8, in the second implementation way of the electrostatic discharge portion 40, the electrostatic discharge portion 40 is made of a metal material, the touch electrode TP or the TP bridge is also med of a metal material. Therefore, the electrostatic discharge portion 40 may contain the same material and arranged on the same layer with the touch electrode TP or the TP bridge. When both the touch electrode TP and the TP bridge are made of metal material, the electrostatic discharge portion 40 may be arranged on the same layer with both the touch electrode TP and the TP bridge. In the direction perpendicular to the substrate 00, the electrostatic discharge portion 40 is located at one side of the touch wire TL facing away from the display area AA. In an embodiment, the electrostatic discharge portion 40 is located between the touch wire TL and the blocking portion 50. The electrostatic discharge portion 40 does not overlap with the blocking portion 50 or partially overlaps with the blocking portion 50. In an embodiment, the electrostatic discharge portion 40 may be provided with a gap to dividing the electrostatic discharge portion 40 into two parts.

In a manufacturing process of the OLED panel provided in the embodiment, the electrostatic discharge portion 40 and the touch electrode TP/TP bridge can be formed at the same time by patterning the same conductive layer, and it is unnecessary to add an additional process and additional materials to manufacture the electrostatic discharge portion 40, thereby being beneficial to enhance a manufacturing efficiency and reduce a manufacturing cost for the OLED panel. In addition, the electrostatic discharge portion 40 and the touch electrode TP/TP bridge are arranged in the same layer, and it is unnecessary to add an additional layer structure, thereby being beneficial to achieve a light and thin OLED panel.

In the OLED panel provided in the embodiments of the present disclosure, the blocking portion may have various structures. The structure of the blocking portion according to the present disclosure is described exemplarily hereinafter.

Figure 9:
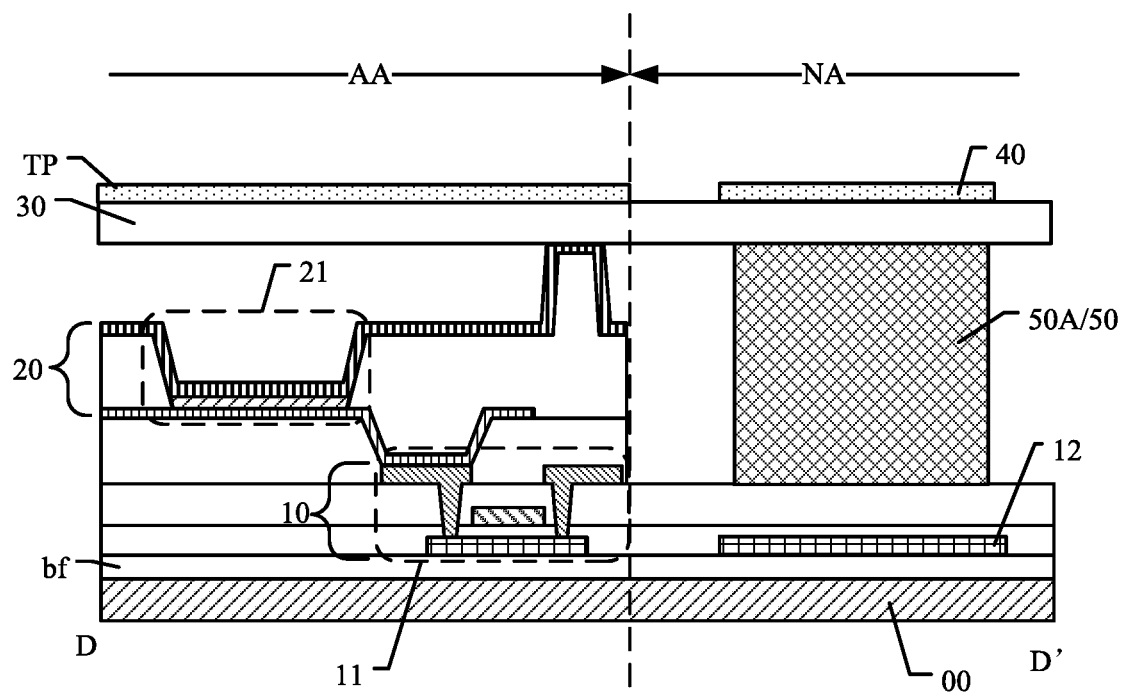
FIG. 9 is a schematic view showing another sectional structure of the OLED panel along the line DD' in FIG. 5.
Figure 10:
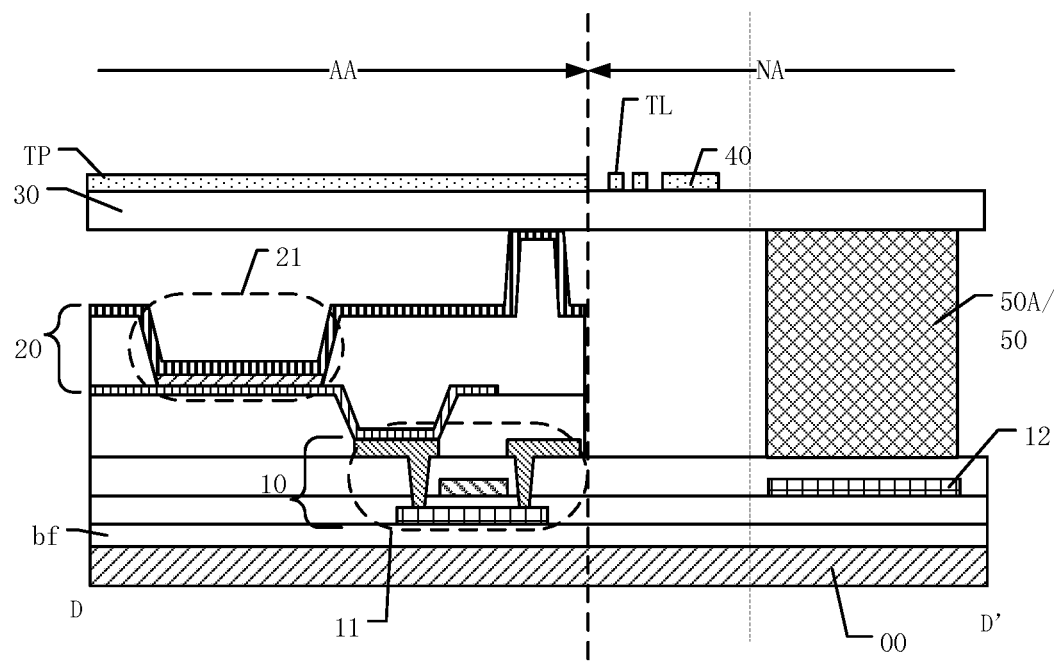
FIG. 10 is a schematic view showing another sectional structure of the OLED panel along the line DD' in FIG. 7.

In one embodiment, one structure of the blocking portion is shown in FIGS. 9-10. The OLED panel further includes an encapsulation metal pad 12, and the blocking portion 50 includes packaging adhesive 50A.

The encapsulation metal pad and one layer included in the driving device layer 10 are formed with a same process. The packaging adhesive 50A is located on a side of the encapsulation metal pad 12 facing away from the substrate 00. The encapsulation layer 30 is attached to the substrate 00 through the packaging adhesive 50A.

In the embodiment, the OLED panel is hard. The encapsulation layer 30 may be made of a glass substrate, and is attached to the substrate 00 and the film structure arranged on the substrate 00 through the packaging adhesive 50A. It should be noted that the packaging adhesive 50A is not in direct contact with the substrate 00. Other film structure may be arranged between the packaging adhesive 50A and the substrate 00, which is not limited in the embodiment of the present disclosure.

The packaging adhesive 50A is usually made of inorganic glue material. After the packaging adhesive 50A is coated on the substrate, the packaging adhesive is solidified via a laser. The encapsulation metal pad 12 has a reflection function. The laser irradiates to the encapsulation metal pad 12 and is reflected. At least a part of the reflected light further solidifies the packaging adhesive. The encapsulation metal pad 12 may enhance a solidifying efficiency of the packaging adhesive.

In one embodiment, the encapsulation metal pad 12 and gates of the thin film transistors 11 are arranged on the same layer. The encapsulation metal pad 12 may be a closed loop, or may have a non-closed shape.

In the first implementation way of the transparent electrostatic discharge portion 40, in the direction perpendicular to the substrate 00, the electrostatic discharge portion 40 at least partially overlaps with the packaging adhesive 50A.

When the external static electricity enters the OLED panel, the static electricity passes the electrostatic discharge portion 40 arranged in the non-display area NA. The electrostatic discharge portion 40 discharges the static electricity, and the static electricity cannot pass the encapsulation layer 30 and the packaging adhesive 50A to reach other film structures of the OLED panel, thereby preventing the external static electricity from damaging the packaging adhesive 50A. Therefore, a failure of the encapsulation glue 50A is prevented and a reliability of the OLED panel is improved.

In the second implementation way of the metal electrostatic discharge portion 40, in the direction perpendicular to the substrate 00, the electrostatic discharge portion 40 is located between the touch wire TL and the blocking portion 50. When the external static electricity enters the OLED panel, the static electricity passes the electrostatic discharge portion 40 arranged in the non-display area NA. The electrostatic discharge portion 40 discharges the static electricity. The static electricity cannot pass the encapsulation layer 30 to reach other film structures of the OLED panel, thereby preventing the external static electricity from damaging the blocking portion 50 and the light emitting device layer 20. Therefore, a reliability of the OLED panel is improved.

In addition, when the external static electricity enters the display panel from a side close to the encapsulation layer 30, the static electricity discharges from the electrostatic discharge portion 40 close to the encapsulation layer. When the external static electricity enters the display panel from a side close to the substrate 00, the static electricity discharges from the encapsulation metal pad 12 close to the substrate 00. The electrostatic discharge portion 40 and the encapsulation metal pad 12 cooperate to prevent the external static electricity from entering the blocking portion 50, thereby further enhancing the reliability of the OLED panel.

In one embodiment, to improve the solidification property of the packaging adhesive, the electrostatic discharge portion may have a structure.

In one embodiment, as illustrated in FIGS. 11-14, in a case that the OLED panel includes the encapsulation metal pad 12 and the packaging adhesive 50A, the electrostatic discharge portion 40 may include multiple hollowed-out portions 40A.

Figure 11:
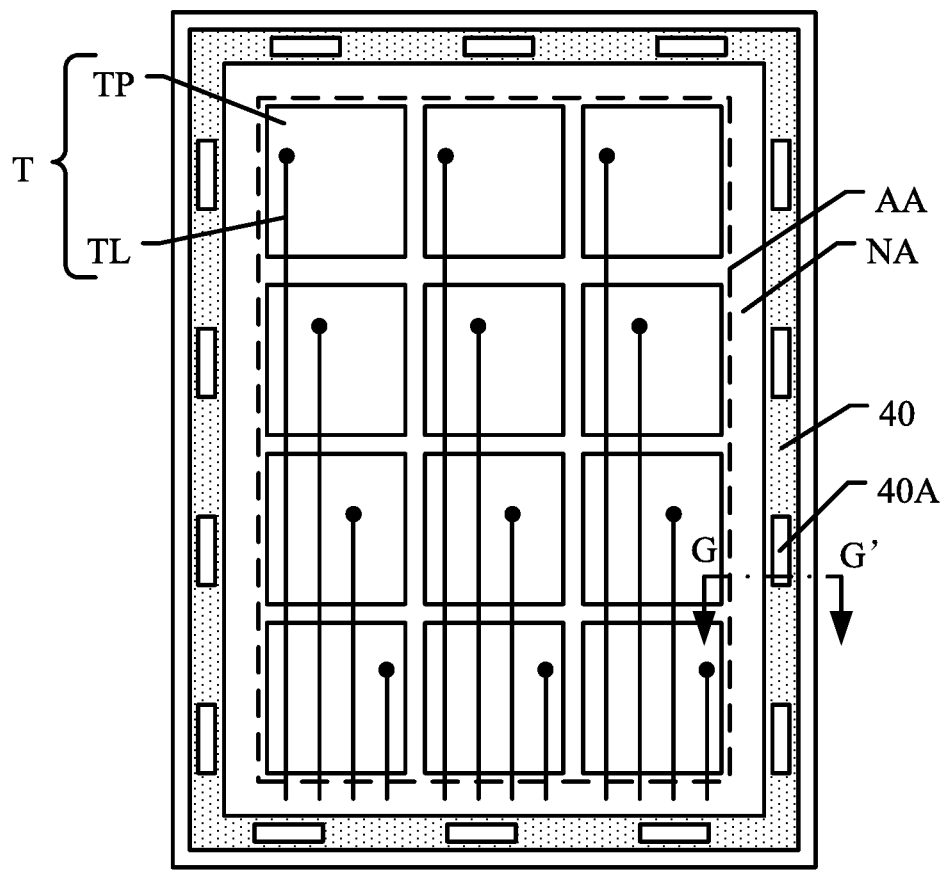
FIG. 11 is a schematic view showing a planar structure of an OLED panel according to an embodiment of the present disclosure.
Figure 12:
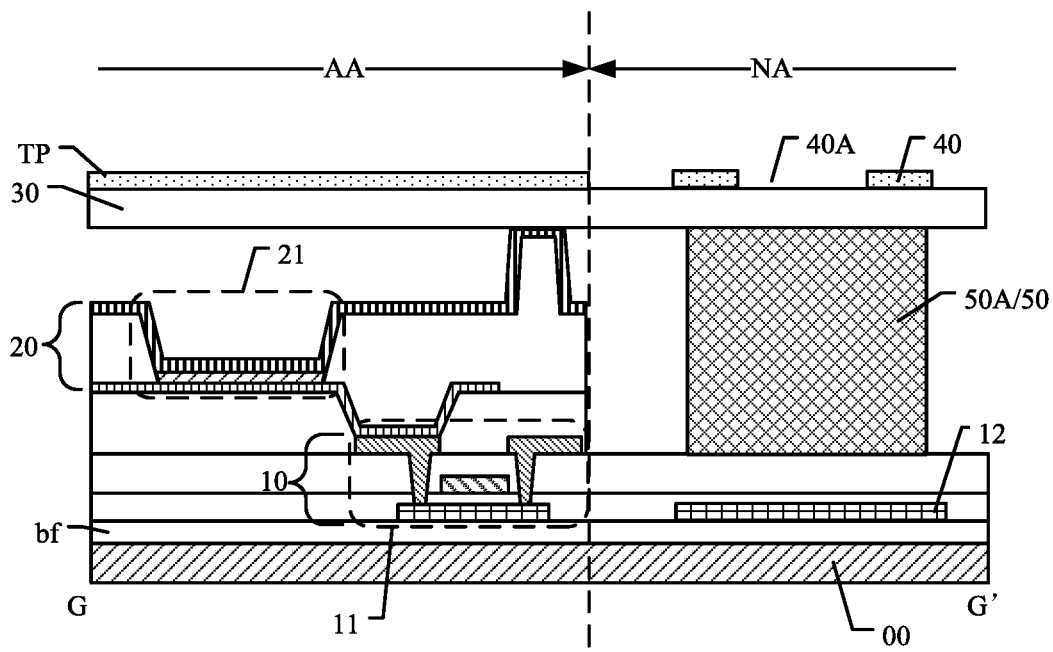
FIG. 12 is a schematic view showing a sectional structure of the OLED panel along a line GG' in FIG. 11.

As shown in FIGS. 11-12, in the first implementation way of the electrostatic discharge portion 40, the hollowed-out portions 40A overlap with the packaging adhesive 50A in the direction perpendicular to the substrate 00. To further reduce the influence of the electrostatic discharge portion 40 on the transmittance of the laser, the multiple hollowed-out portions 40A are arranged in the electrostatic discharge portion 40. A part of the laser can pass through the hollowed-out portions 40A to enhance the transmittance of the laser, thereby enhancing the solidification efficiency of the packaging adhesive 50A.

Figure 15:
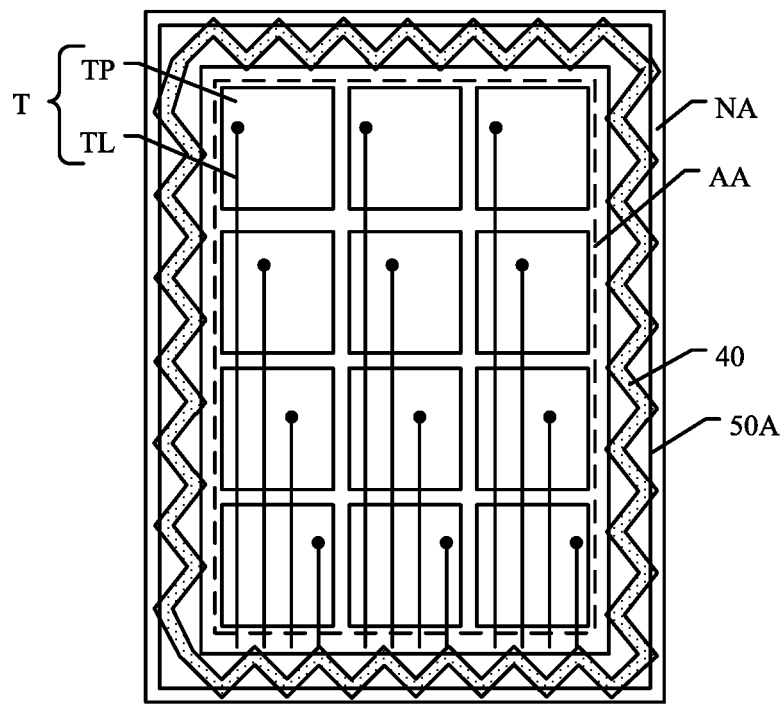
FIG. 15 is a schematic view showing a planar structure of an OLED panel according to an embodiment of the present disclosure.

In one embodiment, as illustrated in FIG. 15, at least a part of a wire of the electrostatic discharge portion 40 has a shape of polygonal line. In one embodiment, a region where the packaging adhesive 50A is located is illustrated by a dashed box in FIG. 15. The electrostatic discharge portion 40 is arranged to have the shape of polygonal line, and an overlapping area between the electrostatic discharge portion 40 and the packaging adhesive 50A can be reduced. Therefore, the transmittance of the laser is enhanced, and the solidification efficiency of the packaging adhesive 50A is enhanced. In addition, the shape of polygonal line is beneficial to expand the region where the electrostatic discharge portion 40 is located, and expand an electrostatic protection scope of the electrostatic discharge portion 40, thereby further enhancing the reliability of the display panel.

Figure 13:
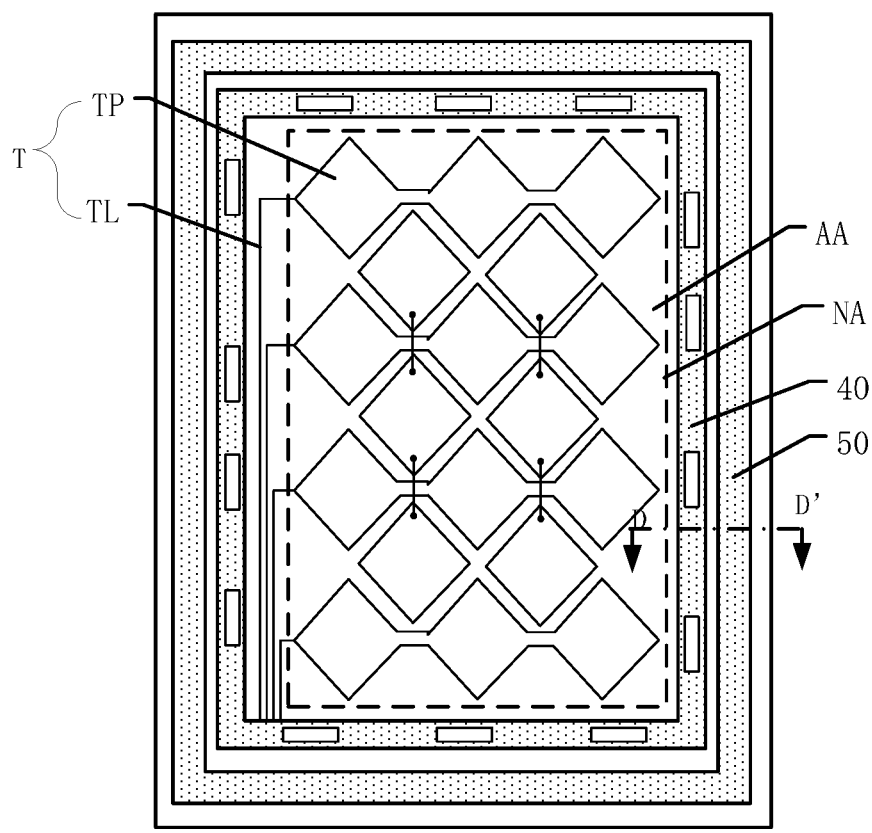
FIG. 13 is a schematic view showing a planar structure of an OLED panel according to an embodiment of the present disclosure.
Figure 14:
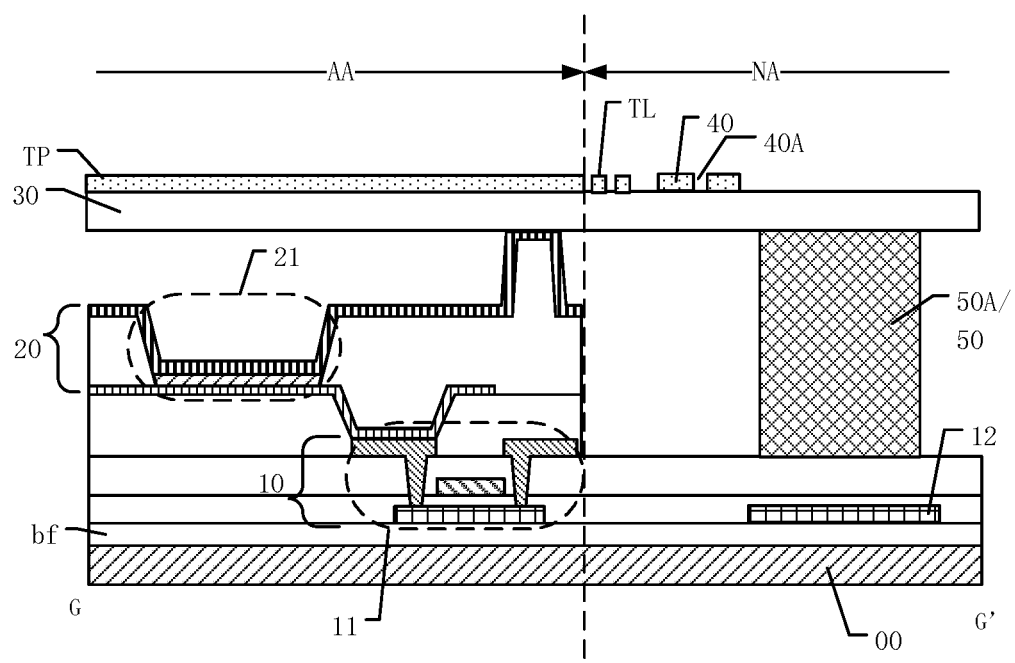
FIG. 14 is a schematic view showing a sectional structure of the OLED panel along a line GG' in FIG. 13.

As shown in FIGS. 13-14, in the second implementation way of the electrostatic discharge portion 40, in the direction perpendicular to the substrate 00, the hollowed-out portions 40A does not overlap or partially overlaps with the packaging adhesive 50A. To further reduce the influence of the electrostatic discharge portion 40 on the transmittance of the laser, the multiple hollowed-out portions 40A are arranged in the electrostatic discharge portion 40. A part of the laser can pass through the hollowed-out portions 40A to enhance the transmittance of the laser, thereby enhancing the solidification efficiency of the packaging adhesive 50A.

In addition, in the second implementation way of the electrostatic discharge portion 40, at least a part of a wire of the electrostatic discharge portion 40 may also have a shape of polygonal line.

In addition, the electrostatic discharge portion 40 is arranged on the side of the encapsulation layer 30 facing away from the substrate 00 rather than on a side of the encapsulation layer 30 close to the substrate 00, and the electrostatic discharge portion 40 is not too close to the packaging adhesive 50, thereby preventing that in the process of solidifying the encapsulation glue 50A by laser, a lot of generated heat burns the electrostatic discharge portion 40.

Figure 16:
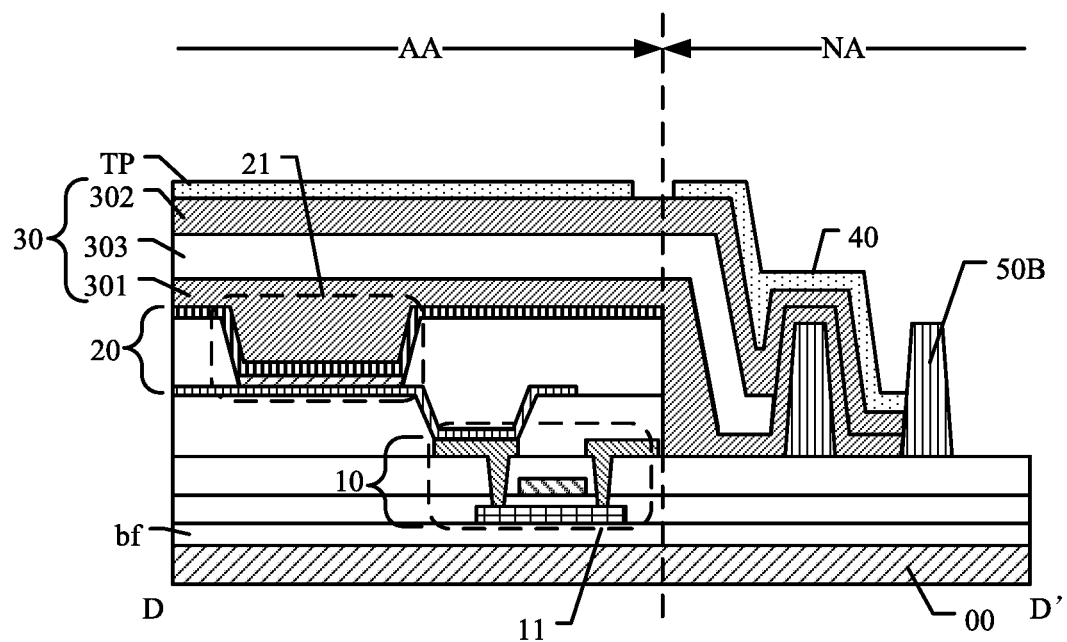
FIG. 16 is a schematic view showing a sectional structure of the OLED panel along the line DD' in FIG. 5.
Figure 17:
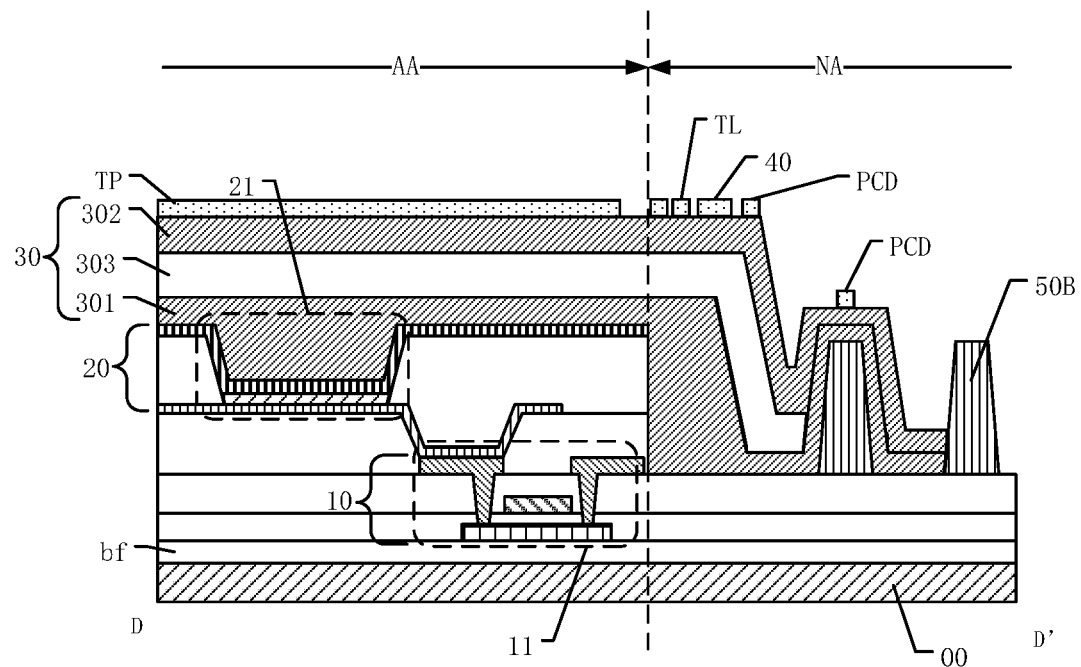
FIG. 17 is a schematic view showing a sectional structure of the OLED panel along the line DD' in FIG. 7.
Figure 18:
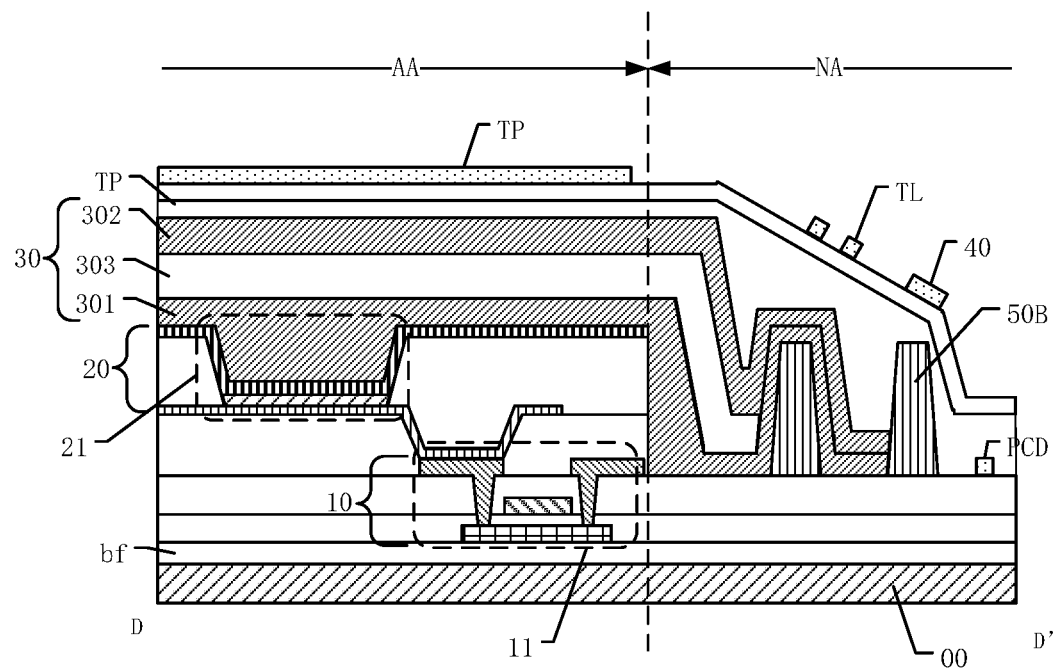
FIG. 18 is a schematic view showing a sectional structure of the OLED panel along the line DD' in FIG. 7.

In one embodiment, another structure of the blocking portion is shown in FIGS. 16-18. The blocking portion 50 includes a bank 50B.

The encapsulation layer 30 is a thin film encapsulation layer covering a surface on a side of the bank 50B facing away from the substrate 00.

As shown in FIG. 16, in the first implementation way of the electrostatic discharge portion 40, the electrostatic discharge portion 40 and at least one bank 50B at least partially overlap in the direction perpendicular to the substrate 00.

In the embodiment, the encapsulation layer of the OLED panel is the thin film encapsulation (TEE) layer. The thin film encapsulation layer has both a good isolating effect and a bendable performance. The use of the thin film encapsulation layer is beneficial to manufacturing of a flexible OLED panel.

In one embodiment, the thin film encapsulation layer 30 includes an inorganic layer 301, an inorganic layer 302, and an organic layer 303. The organic layer 303 is arranged between the two inorganic layers.

The bank 50B is arranged in the non-display area NA. In one embodiment, the bank 50B is annular and is arranged around the display area AA. In one embodiment, the number of the banks 50B may be two to further enhance a blocking effect.

The electrostatic discharge portion 40 is arranged on the side of the encapsulation layer 30 facing away from the substrate 00 rather than on the side of the encapsulation layer 30 close to the substrate 00, and the electrostatic discharge portion 40 is not too close to conductive structures (such as the anode and the cathode of the OLED, and the signal line) in the display area AA, thereby reducing a coupling capacitance between the electrostatic discharge portion 40 and the conductive structures in the display area AA, reducing interference on the conductive structures in the display area AA from the electrostatic discharge portion 40, and thus improving a display quality.

In the first implementation way of the electrostatic discharge portion 40, in the direction perpendicular to the substrate 00, the electrostatic discharge portion 40 at least partially overlaps with the bank 50B. When the external static electricity enters the OLED panel, the static electricity passes the electrostatic discharge portion 40 arranged in the non-display area NA. The electrostatic discharge portion 40 discharges the static electricity, and the static electricity cannot pass the encapsulation layer 30 and the bank 50B to reach other film structures of the OLED panel, thereby preventing the external static electricity from damaging the bank 50B. Therefore, a failure of the bank 50B is prevented and a reliability of the OLED panel is improved.

In addition, a cathode signal line (which is not illustrated in drawings) that transmits an electrical signal to the cathode of the OLED is usually arranged in the OLED panel. The cathode signal line is arranged in the non-display area and has a static electricity discharge capacity. The cathode signal line and the sources of the thin film transistors are arranged on the same layer. When the external static electricity enters the display panel from the side close to the encapsulation layer 30, the static electricity discharges from the electrostatic discharge portion 40 close to the encapsulation layer 30. When the external static electricity enters the display panel from the side close to the substrate 00, the static electricity discharges from the cathode signal line. The electrostatic discharge portion 40 and the cathode signal line cooperate to prevent the external static electricity from entering the blocking portion 50, thereby further enhancing the reliability of the OLED panel.

In one embodiment, the touch layer T is arranged on a side of the thin film encapsulation layer facing away from the substrate 00. The touch layer T includes the touch electrode TP and the touch wire TL.

FIG. 17 illustrates an OLED with a TPOP (touch panel on thin film encapsulation) structure. As shown in FIG. 17, in the second implementation way of the electrostatic discharge portion 40, the electrostatic discharge portion 40 is made of a metal material and does not overlap with the banks 50B in the direction perpendicular to the substrate 00.

In the OLED shown in FIG. 17, the metal electrostatic discharge portion 40 is arranged in a same layer with the metal touch electrode TP and/or the metal TP bridge. Therefore, the electrostatic discharge portion 40 and the touch electrode TP/TP bridge can be formed at the same time by patterning the same conductive layer, and it is unnecessary to add an additional process and additional materials to manufacture the electrostatic discharge portion 40, thereby being beneficial to enhance a manufacturing efficiency and reduce a manufacturing cost for the OLED panel. In addition, the electrostatic discharge portion 40 and the touch electrode TP/TP bridge are arranged in the same layer, and it is unnecessary to add an additional layer structure, thereby being beneficial to achieve a light and thin OLED panel.

In an embodiment, the electrostatic discharge portion 40 is located between the touch wire TL and a panel crack detection (PCD) wire of the OLED panel. The PCD wire is located on a side of the encapsulation layer 30 facing away from the substrate 00. The PCD wire may overlap or do not overlap with the banks 50 in the direction perpendicular to the substrate 00.

Conventionally, in the manufacturing process of the display panel, the base substrate and/or other layers may have cracks since the display panel is impacted, and the cracks will be longer and lager with time. Therefore, a PCD wire is arranged around the non-display area NA to detect such cracks.

In the second implementation way of the electrostatic discharge portion 40, when the external static electricity enters the OLED panel, the static electricity passes the electrostatic discharge portion 40 arranged in the non-display area NA. The electrostatic discharge portion 40 discharges the static electricity. The static electricity cannot pass the encapsulation layer 30 to reach other film structures of the OLED panel, thereby preventing the external static electricity from damaging the banks 50B and the light emitting device layer 20. Therefore, a reliability of the OLED panel is improved.

FIG. 18 illustrates an OLED with a touch panel film structure (on cell touch panel). As shown in FIG. 18, in the second implementation way of the electrostatic discharge portion 40, the electrostatic discharge portion 40 is made of a metal material. In the direction perpendicular to the substrate 00, the electrostatic discharge portion 40 may partially overlap with the banks 50. In one embodiment, the electrostatic discharge portion 40 does not overlap with the banks 50.

In an embodiment, as shown in FIG. 18, the electrostatic discharge portion 40 is arranged on the same layer with the metal touch electrode TP and/or metal TP bridge. Therefore, the electrostatic discharge portion 40 and the touch electrode TP/TP bridge can be formed at the same time by patterning the same conductive layer, and it is unnecessary to add an additional process and additional materials to manufacture the electrostatic discharge portion 40, thereby being beneficial to enhance a manufacturing efficiency and reduce a manufacturing cost for the OLED panel. In addition, the electrostatic discharge portion 40 and the touch electrode TP/TP bridge are arranged in the same layer, and it is unnecessary to add an additional layer structure, thereby being beneficial to achieve a light and thin OLED panel.

In an embodiment, as shown in FIG. 18, in the direction perpendicular to the substrate 00, the electrostatic discharge portion 40 is arranged between the touch wire TL and the PCD wire of the OLED panel. The PCD wire is located between the encapsulation layer 30 and the substrate 00. The PCD wire does not overlap with the banks 50.

In an embodiment, as shown in FIG. 18, the TP electrode is an ITO electrode, the TP bridge is metal, and the electrostatic discharge portion 40 is arranged at the same layer with the TP bridge. In an example, the touch wire TL and the GND signal wire are both one-layer metal structure.

In the OLED panel according to the embodiments of the present disclosure, the electrostatic discharge portion may receive no electrical signal (in a floating state), or may receive an electrical signal with a low potential, which is described hereinafter.

In one embodiment, as illustrated in FIGS. 1-4, the electrostatic discharge portion 40 is annular. The electrostatic discharge portion 40 may receive no electrical signal, i.e., in the floating state. The external static electricity discharges in the electrostatic discharge portion 40.

In one embodiment, the electrostatic discharge portion may receive a low potential signal. The low potential signal may be a GND signal, a VGL signal, or a PVEE signal.

In one embodiment, the GND signal has a ground potential.

A pixel driving circuit is generally arranged in the OLED panel. The VGL signal is a general signal in the driving circuit. The electrostatic discharge portion may reuse the VGL signal. Both the display area AA and the non-display area NA are provided with a signal line configured to transmit the VGL signal.

Figure 20:
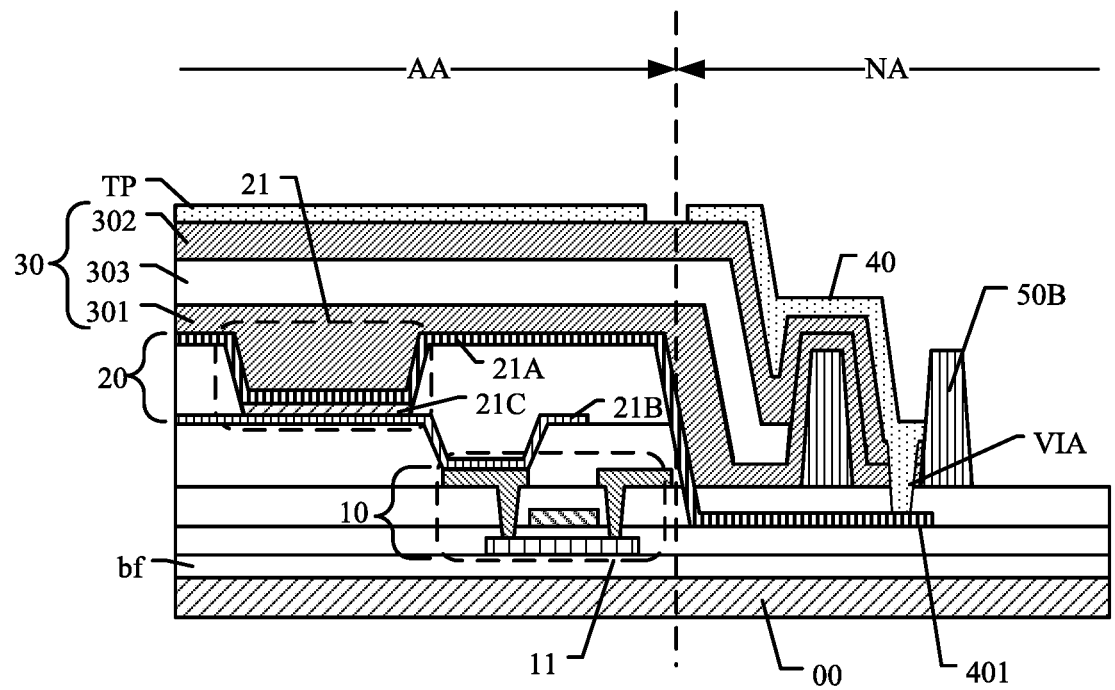
FIG. 20 is a schematic view showing a sectional structure of an OLED panel according to an embodiment of the present disclosure.

In the OLED panel, the cathode of the OLED 21 is connected with a fixed voltage. The fixed voltage is the PVEE signal. Both the display area AA and the non-display area NA are provided with a signal line configured to transmit the PVEE signal. In one embodiment, the cathode of the OLED covers the whole surface. The electrostatic discharge portion may be directly electrically connected with the cathode of the OLED. In one embodiment, as illustrated in FIG. 20, the OLED 21 includes a cathode 21A, an anode 21B, and a luminescent material 21C arranged between the cathode 21A and the anode 21B. The cathode 21A of the OLED 21 covers the display area AA and extends to the non-display area NA. The electrostatic discharge portion 40 is electrically connected with the cathode 21A through a via hole VIA in the thin film encapsulation layer. Therefore, it is unnecessary to arrange an additional signal line to transmit the electrical signal to the electrostatic discharge portion 40, thereby being beneficial to simplify a structure of the OLED panel. This structure is also applicable to the second implementation way of the electrostatic discharge portion 40.

The low potential signal may be transmitted via a conductive bonding pad in the OLED panel. The electrostatic discharge portion may be connected to the conductive bonding pad that provides the low potential signal in multiple manners.

Figure 19:
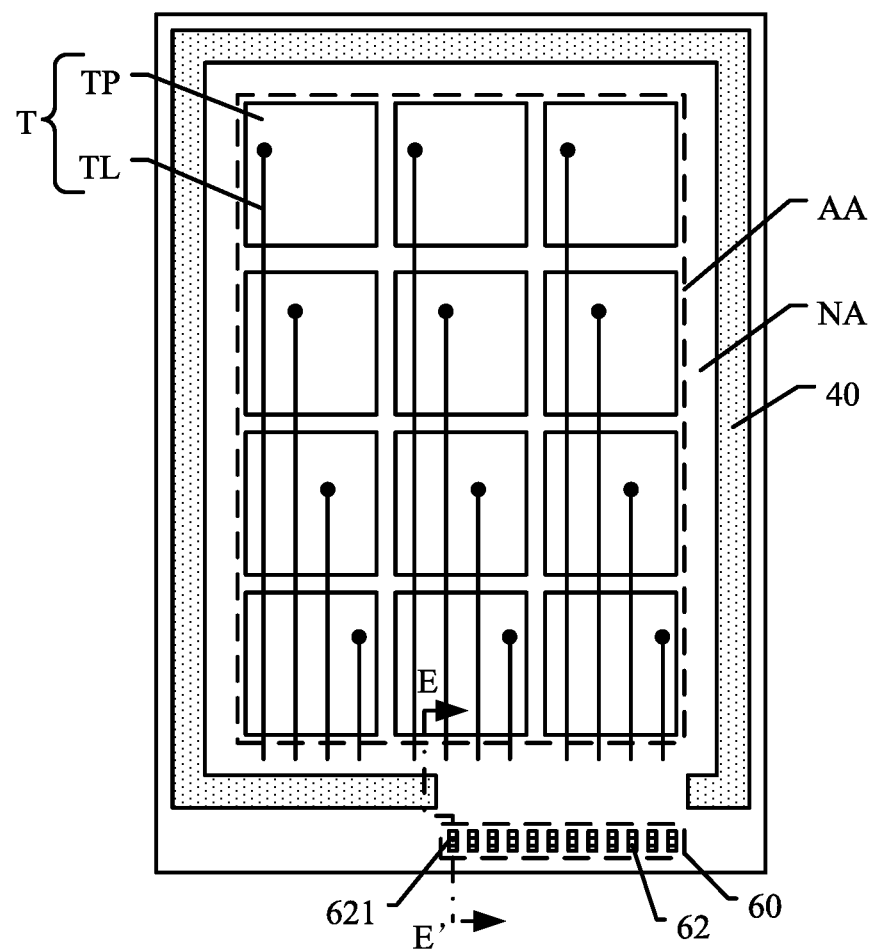
FIG. 19 is a schematic view showing a planar structure of an OLED panel according to an embodiment of the present disclosure.
Figure 21:
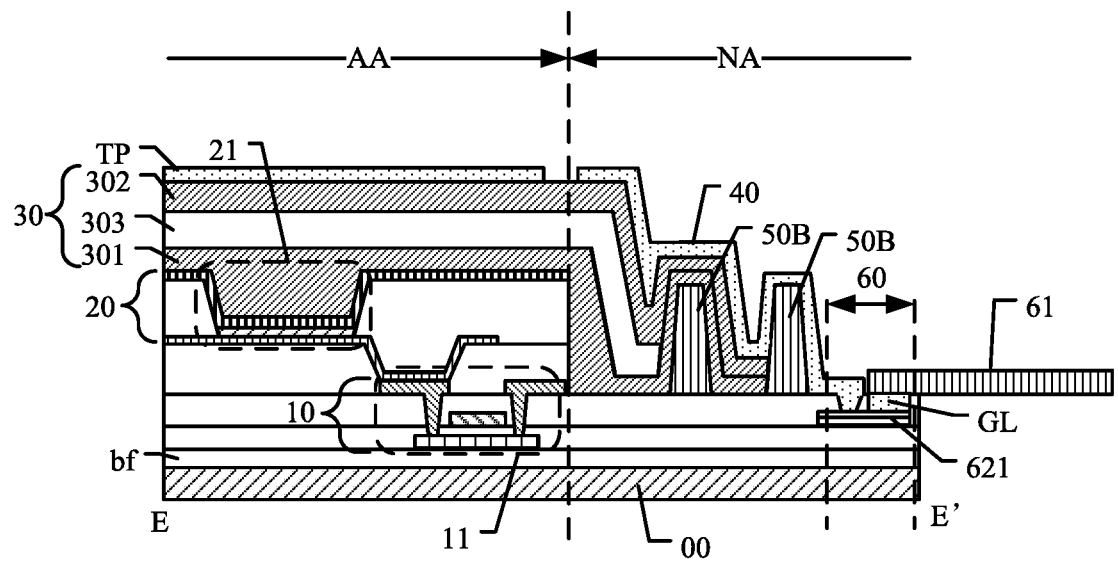
FIG. 21 is a schematic view showing a sectional structure of the OLED panel along a line EE' in FIG. 19.

In some embodiments, as illustrated in FIG. 19 and FIG. 21, the OLED panel further includes a bonding area 60 and a flexible printed circuit 61. The bonding area 60 includes multiple bonding pads 62. The bonding pads 62 and one layer included in the driving device layer 10 are formed with a same process, and the flexible printed circuit 61 is electrically connected with the bonding pads 62.

The multiple bonding pads 62 include a low potential bonding pad 621, and the electrostatic discharge portion 40 is electrically connected with the low potential bonding pad 621.

FIGS. 19-21 are illustrated by using the first implementation way of the electrostatic discharge portion 40 as an example. Similarly, the structure of FIGS. 19-21 are also applicable to the second implementation way of the electrostatic discharge portion 40.

In one embodiment, the bonding pad 62 and the source and drain of the thin film transistor 11 are arranged in the same layer. The flexible printed circuit (FPC) may transmit an electrical signal. The flexible printed circuit 61 is electrically connected with the bonding pads 62 via conductive adhesive GL.

In one embodiment, the thin film encapsulation layer is adopted in the OLED panel provided in the embodiment. The thin film encapsulation layer covers at least one bank 50B. The electrostatic discharge portion 40 covers the bank 50B and extends to the bonding area 60.

The electrostatic discharge portion 40 is electrically connected with the low potential bonding pad 621 in the bonding area 60.

In one embodiment, the touch layer T is arranged on the side of the thin film encapsulation layer facing away from the substrate 00. The touch layer T includes the touch electrode TP and the touch wire TL. The touch wire TL may also be electrically connected with the bonding pads 62 through the via hole in the thin film encapsulation layer, and the flexible printed circuit 61 transmits the electrical signal for the touch wire TL, which is not repeated in the embodiment.

The multiple bonding pads 62 include at least one low potential bonding pad 621. The low potential bonding pad 621 receives the low potential signal transmitted by the flexible printed circuit 61. In one embodiment, the low potential bonding pad transmits the GND signal, the VGL signal, or the PVEE signal. A bonding pad electrically connected with the electrostatic discharge portion 40 is the low potential bonding pad.

The flexible printed circuit 61 is not shown in FIG. 19.

Figure 22:
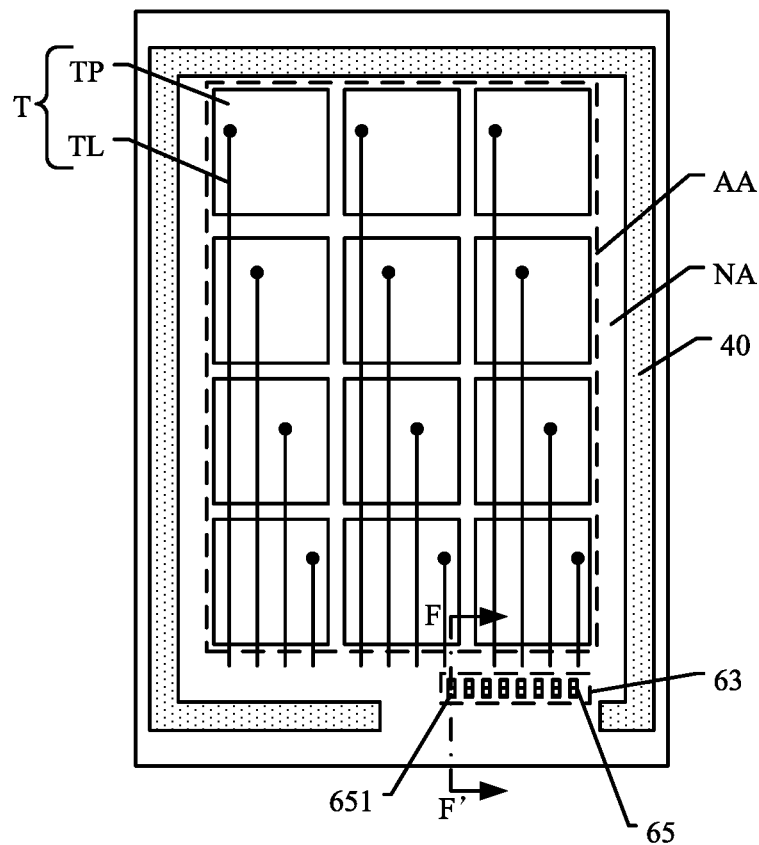
FIG. 22 is a schematic view showing a planar structure of an OLED panel according to an embodiment of the present disclosure.
Figure 23:
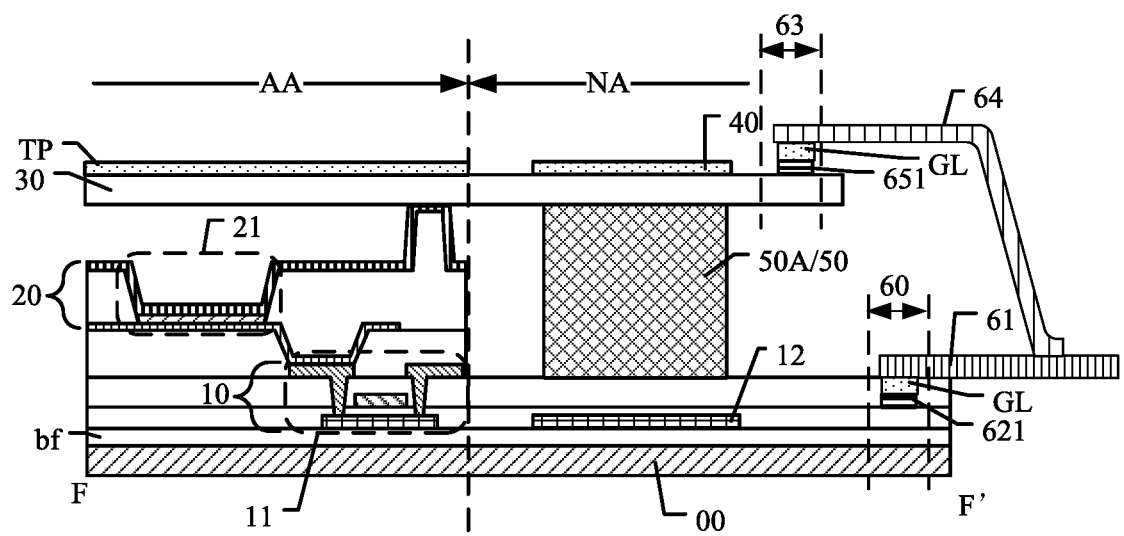
FIG. 23 is a schematic view showing a sectional structure of the OLED panel along a line FF' in FIG. 22.

In some embodiments, as illustrated in FIG. 22 and FIG. 23, the OLED panel further includes an auxiliary bonding area 63 and an auxiliary flexible printed circuit 64.

The auxiliary bonding area 63 includes multiple auxiliary bonding pads 65. The auxiliary flexible printed circuit 64 is electrically connected with the auxiliary bonding pads 65. The auxiliary bonding pads 65 are located on the side of the encapsulation layer 30 facing away from the substrate 00.

The multiple auxiliary bonding pads 65 include a low potential bonding pad 651.

The electrostatic discharge portion 40 is electrically connected with the low potential bonding pad 651.

In the embodiment, the OLED panel may be hard. The encapsulation layer 30 may be made of a glass substrate, and is attached to the substrate 00 and the film structure arranged on the substrate 00 through the packaging adhesive 50A. In one embodiment, the touch layer T is arranged on the side of the thin film encapsulation layer facing away from the substrate 00. The touch layer T includes the touch electrode TP and the touch wire TL.

The auxiliary bonding pads 65 in the auxiliary bonding area 63 are arranged on the side of the encapsulation layer 30 facing away from the substrate 00. The auxiliary flexible printed circuit 64 may be electrically connected with the auxiliary bonding pads 65 via the conductive adhesive GL.

The auxiliary bonding pads 65 and the touch wire TL may be arranged on the same film layer. The touch wire TL may be electrically connected with the auxiliary bonding pads 65. The auxiliary flexible printed circuit 64 may transmit an electrical signal for the touch wire TL.

The multiple bonding pads 65 include at least one low potential bonding pad 651. The low potential bonding pad 651 receives the low potential signal transmitted by the auxiliary flexible printed circuit 64. In one embodiment, the low potential bonding pad 651 transmits the GND signal, the VGL signal, or the PVEE signal. A bonding pad electrically connected with the electrostatic discharge portion 40 is the low potential bonding pad 651.

The auxiliary flexible printed circuit 64 is not shown in FIG. 19.

In one embodiment, the OLED panel provided in the embodiment further includes the bonding area 60 and the flexible printed circuit 61. The auxiliary flexible printed circuit 64 is electrically connected with the flexible printed circuit 61.

FIGS. 22-23 are illustrated by using the first implementation way of the electrostatic discharge portion 40 as an example. Similarly, the structure of FIGS. 22-23 are also applicable to the second implementation way of the electrostatic discharge portion 40.

Figure 24:
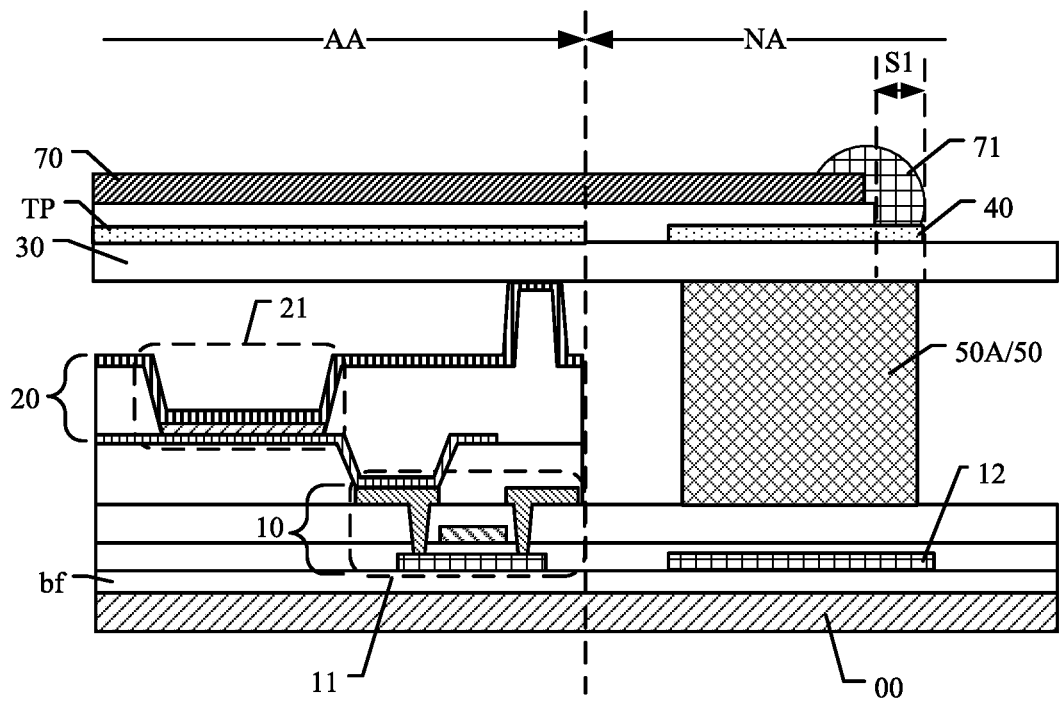
FIG. 24 is a schematic view showing a sectional structure of an OLED panel according to an embodiment of the present disclosure.

In some embodiments, as illustrated in FIG. 24, the OLED panel further includes a polarizer 70 located on a side of the touch layer T facing away from the substrate 00.

The electrostatic discharge portion 40 includes a first area S1. The electrostatic discharge portion 40 in the first area S1 does not overlap with the polarizer 70 in the direction perpendicular to the substrate 00. The electrostatic discharge portion 40 is electrically connected with the polarizer 70 through silver adhesive 71, and the silver adhesive 71 is in direct contact with the electrostatic discharge portion 40 in the first area.

In one embodiment, the polarizer 70 is a low resistance polarizer which has a sheet resistance R, where $10^8 \Omega \leq R \leq 10^9 \Omega$.

In the embodiment, the electrostatic discharge portion 40 is electrically connected with the polarizer 70. When the external static electricity enters the OLED panel, the static electricity entering the electrostatic discharge portion 40 discharges to the polarizer 70 to extend a path in which the static electricity discharges, thereby being beneficial to the static electricity discharge. In one embodiment, a polarizer with a low resistance is selected, and the sheet resistance R of the polarizer is in a range of $10^8 \Omega \leq R \leq 10^9 \Omega$, and the static electricity discharges rapidly in the polarizer, thereby further improving the static electricity protection capacity of the OLED panel and the reliability of the OLED panel.

FIG. 24 is illustrated by using the first implementation way of the electrostatic discharge portion 40 as an example. Similarly, the structure of FIG. 24 is also applicable to the second implementation way of the electrostatic discharge portion 40.

Figure 25:
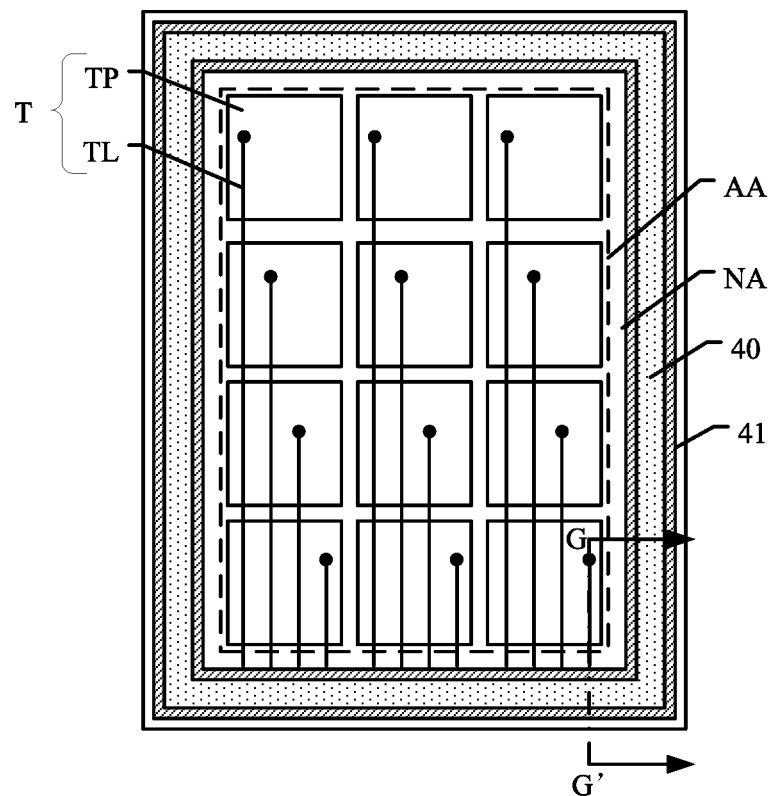
FIG. 25 is a schematic view showing a planar structure of an OLED panel according to an embodiment of the present disclosure.
Figure 26:
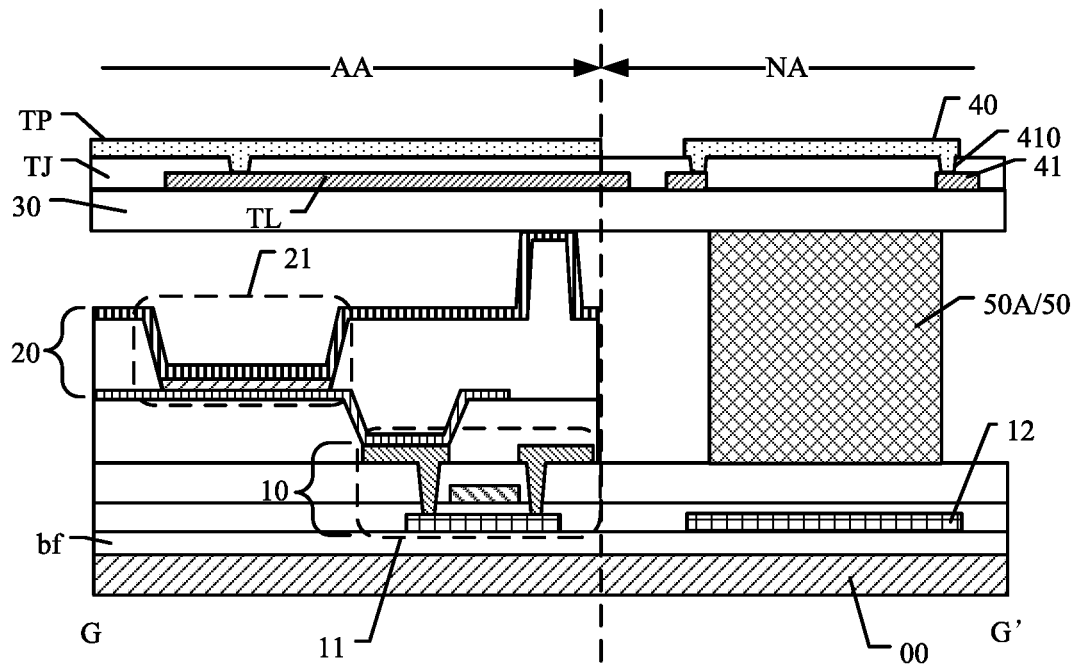
FIG. 26 is a schematic view showing a sectional structure of the OLED panel along a line GG' in FIG. 25.
Figure 27:
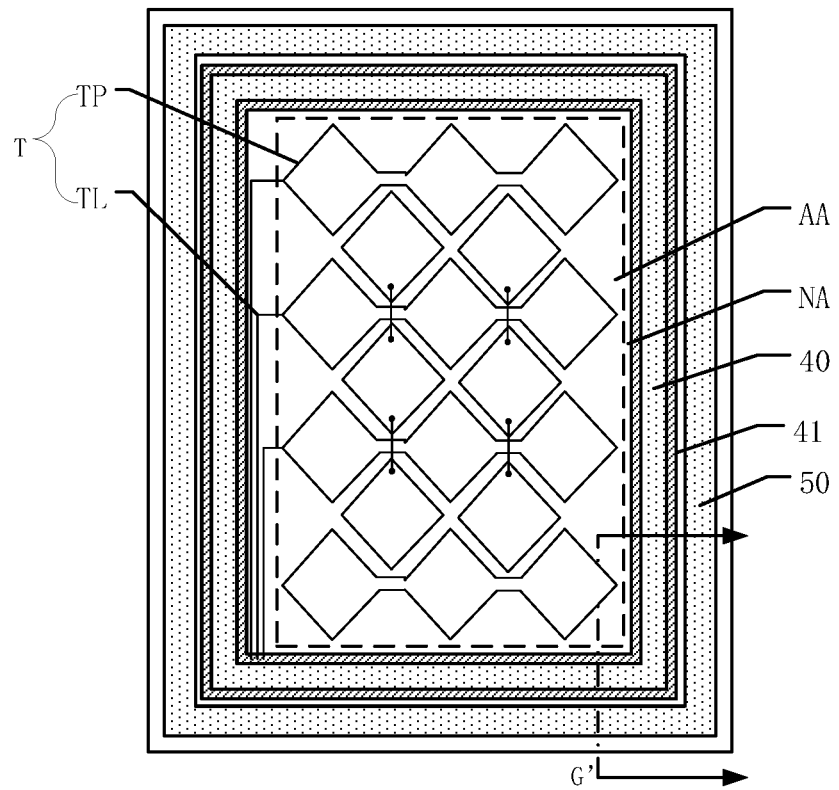
FIG. 27 is a schematic view showing a planar structure of an OLED panel according to an embodiment of the present disclosure.
Figure 28:
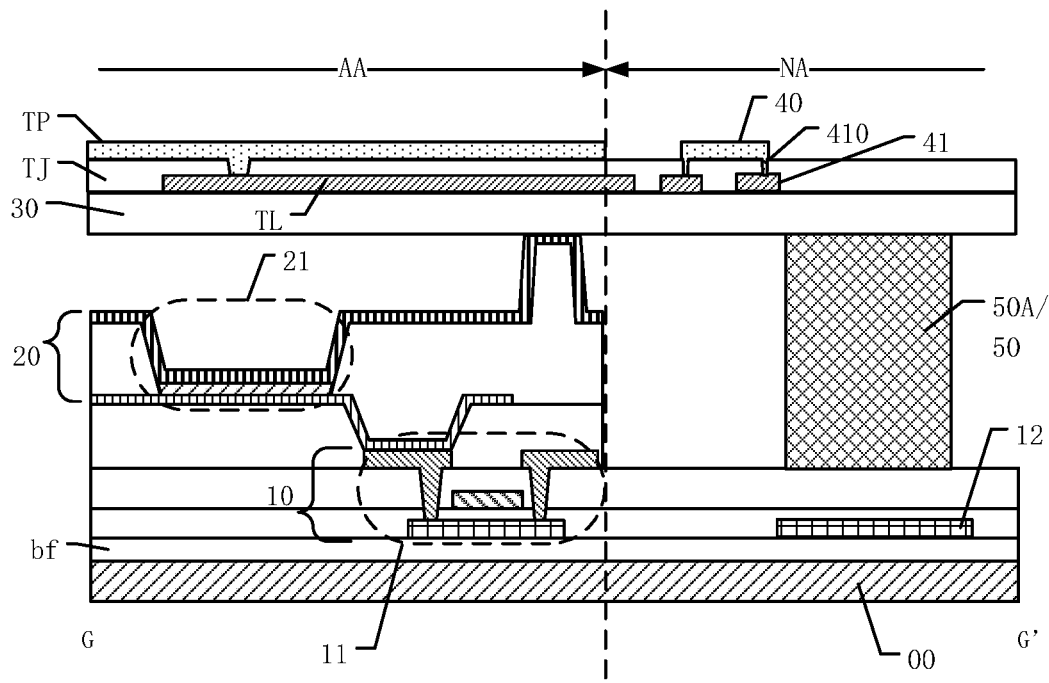
FIG. 28 is a schematic view showing a sectional structure of the OLED panel along a line GG' in FIG. 27.

In one embodiment, as illustrated in FIGS. 25 and 27, in order to further enhance the static discharge capacity of the OLED panel, and enhance the reliability of the OLED panel, the OLED panel further includes an auxiliary static electricity discharge portion 41. The electrostatic discharge portion 40 is electrically connected with the auxiliary electrostatic discharge portion 41.

In the embodiment, the auxiliary electrostatic discharge portion 41 is electrically connected with the electrostatic discharge portion 40, and an equivalent resistance of the auxiliary electrostatic discharge portion 41 and the electrostatic discharge portion 40 is reduced, thereby being beneficial to the rapid discharge of the static electricity, and further improving the reliability of the OLED panel. Besides, in a flexible foldable product, the electrostatic discharge portion may be broken because of repeated folding. The auxiliary electrostatic discharge portion 41 is made of a metal material, has a good extensibility, and is broken with a low probability. In a case that the electrostatic discharge portion is broken, the auxiliary electrostatic discharge portion 41 connects the broken parts together to reduce a risk of a failure.

Figure 29:
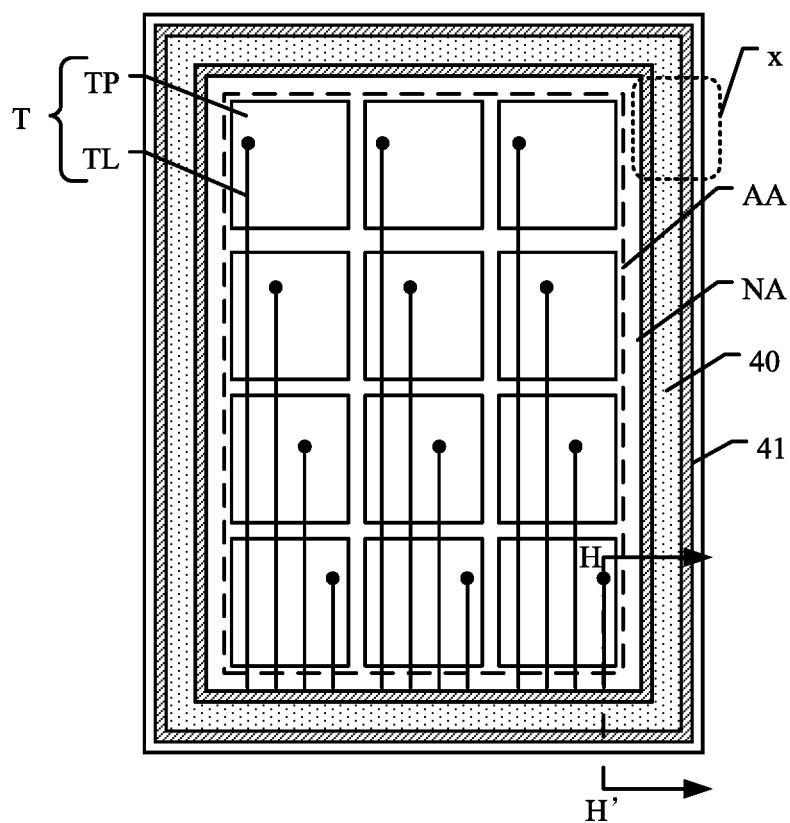
FIG. 29 is a schematic view showing a planar structure of an OLED panel according to an embodiment of the present disclosure.
Figure 30:
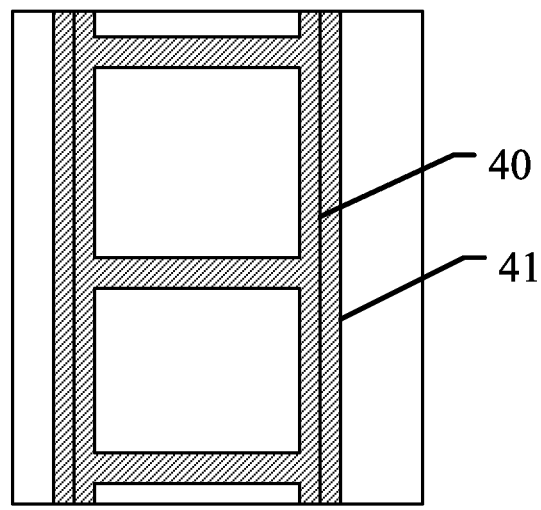
FIG. 30 is schematic view showing a local amplification structure of an area X in FIG. 29.
Figure 31:
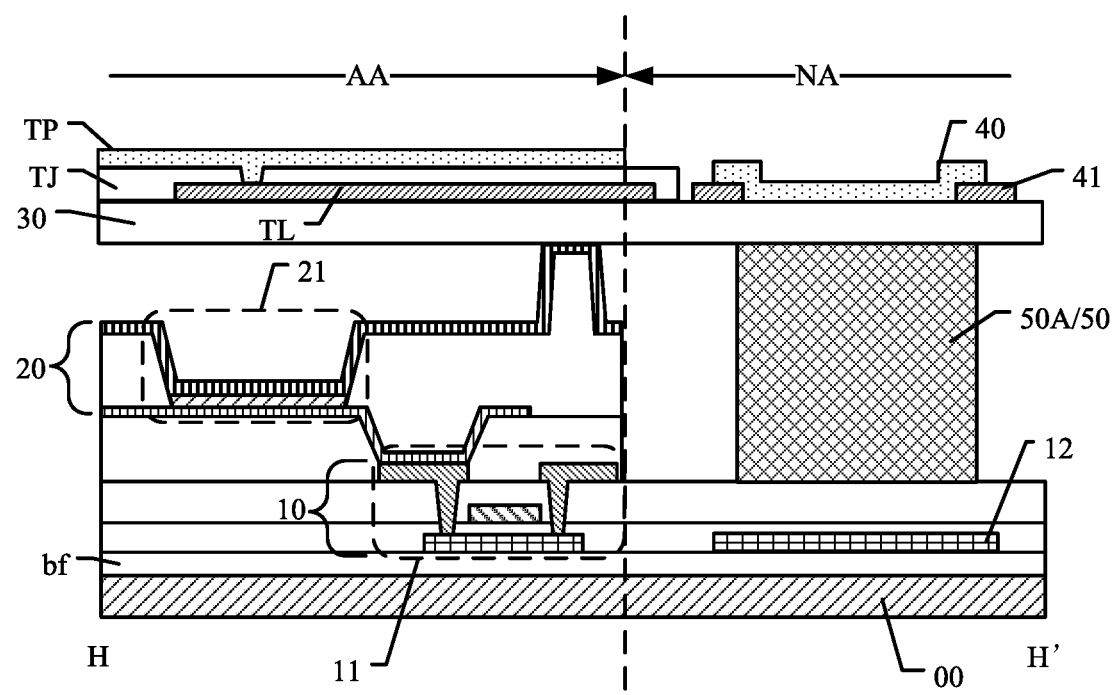
FIG. 31 is a schematic view showing a sectional structure of the OLED panel along a line HH' in FIG. 29.

In one embodiment, the auxiliary electrostatic discharge portion 41 is annular and is arranged around the display area AA. In another embodiment, as illustrated in FIG. 29, FIG. 30, and FIG. 31, the auxiliary electrostatic discharge portion 41 has a shape of grid line. The auxiliary electrostatic discharge portion 41 is arranged to be annular or have the shape of grid line, to reduce an influence of the auxiliary electrostatic discharge portion 41 on the transmittance of the laser, and the influence on the transmittance of the laser is reduced, and the influence on the solidification efficiency of the packaging adhesive 50A is reduced.

The touch wire TL is usually made of a metal material. In an embodiment, the auxiliary electrostatic discharge portion 41 and the touch wire TL contain the same material and are arranged on the same layer. In the manufacturing process of the OLED panel provided in the embodiment, the auxiliary electrostatic discharge portion 41 and the touch wire TL can be formed at the same time by patterning the same conductive layer, and it is unnecessary to add an additional process and additional materials to manufacture the auxiliary electrostatic discharge portion 41, thereby being beneficial to enhance a manufacturing efficiency and reduce a manufacturing cost for the OLED panel. In addition, the auxiliary electrostatic discharge portion 41 and the touch wire TL are arranged on the same layer, and it is unnecessary to add an additional film structure, thereby being beneficial to achieve a light and thin OLED panel.

In the OLED panel provided in the embodiment of the present disclosure, the electrostatic discharge portion 40 and the auxiliary electrostatic discharge portion 41 may be electrically connected to each other in at least two manners.

In one embodiment, with reference to FIGS. 25-28 continuously, a first insulating layer TJ is arranged between the electrostatic discharge portion 40 and the auxiliary electrostatic discharge portion 41. The first insulating layer TJ includes multiple first via holes 410, and the electrostatic discharge portion 40 and the auxiliary electrostatic discharge portion 41 are electrically connected via the first via holes 410. In the embodiment, the number of the first via holes 410 may be more than one. The greater the number of the first via holes 410 is, the more beneficial the equivalent resistance of the electrostatic discharge portion 40 and the auxiliary electrostatic discharge portion 41 can be reduced, thereby being beneficial to rapidly discharge the static electricity, and further enhancing the reliability of the OLED panel. In an embodiment, the structure of the electrostatic discharge portion 40 and the auxiliary electrostatic discharge portion 41 may be applied to the structure shown in FIG. 17. In addition, in an alternative connection manner, the electrostatic discharge portion 40 and the auxiliary electrostatic discharge portion 41 may be electronically connected by connecting the two metal layers of the electrostatic discharge portion 40 and the auxiliary electrostatic discharge portion 41 in a head-to-tail connection manner. The two layers of the electrostatic discharge portions 40 and 41 may be connected in any manner as long as they are connected in parallel.

In one embodiment, as illustrated in FIG. 29, FIG. 30, and FIG. 31, the auxiliary electrostatic discharge portion 41 has a shape of grid line. In one embodiment, the electrostatic discharge portion 40 covers a surface on a side of the auxiliary electrostatic discharge portion 41 facing away from the substrate 00.

In one embodiment, in FIG. 30, the electrostatic discharge portion 40 is provided with no filling pattern, and is only illustrated by a line frame. In the embodiment, the electrostatic discharge portion 40 directly covers a surface of the auxiliary electrostatic discharge portion 41 to realize electrical connection, and a contact area of the electrostatic discharge portion 40 and the auxiliary electrostatic discharge portion 41 becomes larger, thereby being beneficial to reduce the equivalent resistance of the auxiliary electrostatic discharge portion 41 and the electrostatic discharge portion 40, being beneficial to the rapid discharge of the static electricity, and further enhancing the reliability of the OLED panel. This structure is also applicable to the second implementation way of the electrostatic discharge portion 40.

Figure 32:
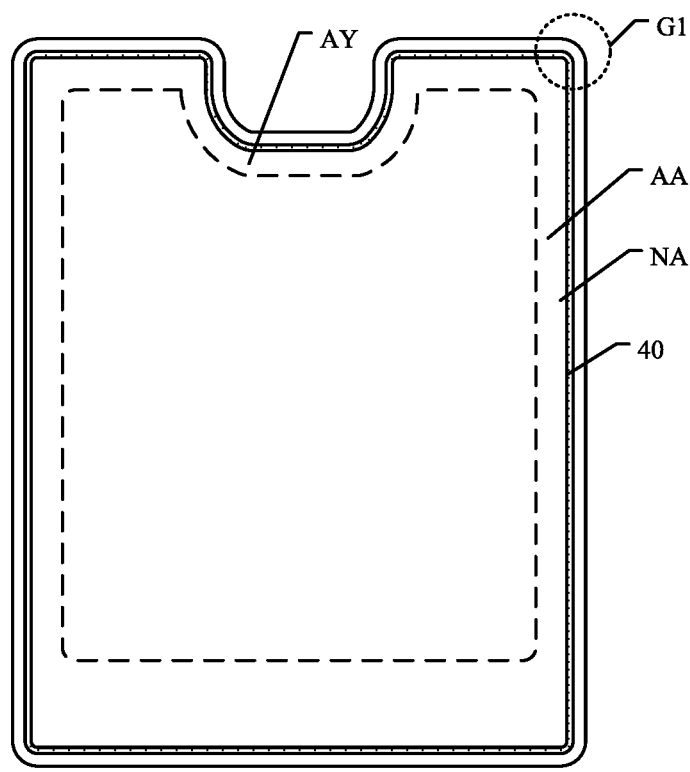
FIG. 32 is a schematic view showing a planar structure of an OLED panel according to an embodiment of the present disclosure.

In some embodiments, as illustrated in FIG. 32, the OLED panel is an irregular-shaped panel, and the display area AA includes at least one segment of irregular-shaped edge AY. The electrostatic discharge portion 40 includes multiple corners G1, and the corners G1 each have a shape of rounded corner. In a display panel, the display area AA is rectangular. With the development of display technology, the irregular-shaped display panel is favored by consumers. In the irregular-shaped display panel, the display area AA is non-rectangular. The display area AA includes at least one segment of irregular-shaped edge AY. The irregular-shaped edge may be a curved segment, or an oblique line segment, which is not limited in the embodiment. In addition, the corner G1 of the electrostatic discharge portion 40 has a rounded corner shape rather than a right angle shape. If the electrostatic discharge portion 40 has a right angle shape or a sharp corner shape, a point discharge phenomenon may appear, and the static electricity gathers at the right angle or the sharp corner, which is not beneficial to the rapid discharge of the static electricity. The corner G1 of the electrostatic discharge portion 40 has a shape of rounded corner, which is beneficial to the discharge of the static electricity in the electrostatic discharge portion.

Figure 33:
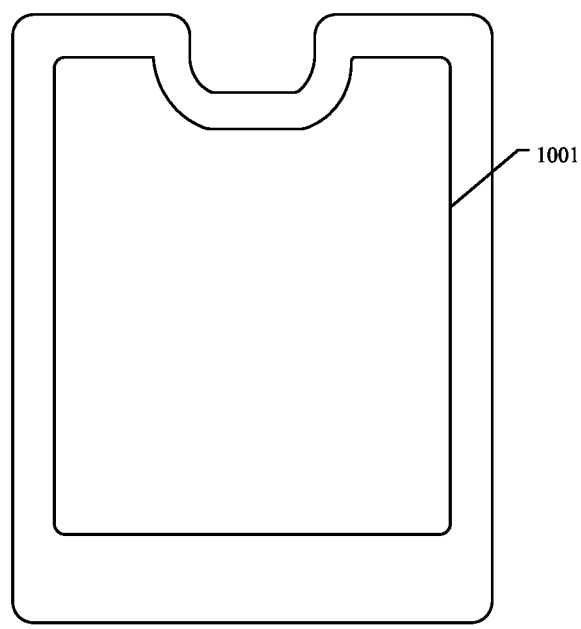
FIG. 33 is a schematic structural view of an OLED device according to an embodiment of the present disclosure.

An OLED device is further provided according to the present disclosure, which includes the OLED panel according to the present disclosure. Reference is made to FIG. 33, which is a schematic structural view of an OLED device according to an embodiment of the present disclosure. The display device 1000 provided in FIG. 33 includes the display panel 1001 according to any one of the above embodiments of the present disclosure. In the embodiment shown by FIG. 33, a mobile phone is taken as an example to describe the display device 1000. It should be understood that the display device provided in the embodiment of the present disclosure may be a computer, a television, a vehicle-mounted display device or other display device with a display function, which is not limited in the present disclosure. The display device provided in the embodiment of the present disclosure has the beneficial effects of the display panel provided in the embodiment of the present disclosure. For the beneficial effects, one may refer to the description of the display panel in each of the above embodiments, and the beneficial effects are not repeated in the embodiment.

It should be known from the above embodiments that the OLED panel and the OLED device provided according to the present disclosure have the at least the following beneficial effects.

The electrostatic discharge portion can discharge static electricity from outside of the OLED panel. The electrostatic discharge portion is arranged in the non-display area and many circuit structures and electronic elements are arranged in the display area, thereby preventing interference on the circuit structures and electronic elements in the display area from the electrostatic discharge portion.

The electrostatic discharge portion is located on the side of the encapsulation layer facing away from the substrate. In the non-display area, some signal wires or driving circuits are usually arranged between the encapsulation layer and the substrate, and the side of the encapsulation layer facing away from the substrate generally has a simple structure. In order not to increase a width of the non-display area, the electrostatic discharge portion is arranged on the side of the encapsulation layer facing away from the e substrate, which is beneficial to achieve a narrow frame of the OLED panel.

The electrostatic discharge portion is made of the metal material or the transparent conductive thin film. The metal material and the transparent conductive thin film are material commonly used in the OLED panel. Since a manufacturing process of the transparent conductive thin film is relatively mature, a process difficulty of manufacturing the electrostatic discharge portion can be reduced, and a manufacturing cost of the OLED panel is reduced.

In the direction perpendicular to the substrate, the electrostatic discharge portion at least partially overlaps with the blocking portion. When the external static electricity enters the OLED panel, the static electricity passes the electrostatic discharge portion arranged in the non-display area. The electrostatic discharge portion discharges the static electricity to prevent that the external static electricity damages the blocking portion. Therefore, a failure of the blocking portion is prevented and a reliability of the OLED panel is improved.

What is claimed is:

1. An organic light emitting display panel, comprising:
a display area, and a non-display area around the display area;
a substrate;
a driving device layer and a light emitting device layer arranged above the substrate, wherein the driving device layer and the light emitting device layer are located in the display area, the driving device layer comprises a plurality of thin film transistors, and the light emitting device layer comprises a plurality of organic light emitting diodes;
an encapsulation layer covering the light emitting device layer; and
a touch layer located on a side of the encapsulation layer facing away from the substrate, the touch layer comprising a touch electrode and a touch wire;
wherein the non-display area comprises an electrostatic discharge portion, the electrostatic discharge portion is made of a conductive material and is located on a side of the encapsulation layer facing away from the substrate;
the non-display area comprises a blocking portion, the blocking portion is arranged around the display area, and the blocking portion is located between the substrate and the encapsulation layer; and
the electrostatic discharge portion is located on a side of the touch wire facing away from the display area,
wherein the blocking portion comprises banks;
the encapsulation layer is a thin film encapsulation layer covering a surface on a side of the bank facing away from the substrate,
wherein the electrostatic discharge portion is made of a metal material, the electrostatic discharge portion is located between the touch wire and a panel crack detection wire of the organic light emitting display panel, and the electrostatic discharge portion does not overlap with the banks.

2. The organic light emitting display panel according to claim 1, wherein
the electrostatic discharge portion is made of a metal material, the electrostatic discharge portion and the touch electrode contain a same first material and are located on a same first layer; and
the organic light emitting display panel further comprises an auxiliary electrostatic discharge portion, the electrostatic discharge portion is electrically connected with the auxiliary electrostatic discharge portion, and the auxiliary electrostatic discharge portion and the touch wire contain a same second material and are arranged on a same second layer, wherein the first material is different from the second material and the first layer is different from the second layer.

3. The organic light emitting display panel according to claim 1, wherein in the direction perpendicular to the substrate, the electrostatic discharge portion is located between the touch wire and the blocking portion, and the electrostatic discharge portion does not overlap with the blocking portion.

4. The organic light emitting display panel according to claim 1, wherein at least one of the panel crack detection wire overlaps with the banks.

5. The organic light emitting display panel according to claim 1, wherein the electrostatic discharge portion is annular and is arranged around the display area.

6. The organic light emitting display panel according to claim 1, further comprising a bonding area and a flexible printed circuit, wherein
the bonding area comprises a plurality of bonding pads, the bonding pads and one layer comprised in the driving device layer are formed with a same process, the flexible printed circuit is electrically connected with the plurality of bonding pads; and
the plurality of bonding pads comprises a low potential bonding pad, and the electrostatic discharge portion is electrically connected with the low potential bonding pad.

7. The organic light emitting display panel according to claim 1, further comprising an auxiliary bonding area and an auxiliary flexible printed circuit, wherein
the auxiliary bonding area comprises a plurality of auxiliary bonding pads, the auxiliary flexible printed circuit is electrically connected with the plurality of auxiliary bonding pads, the plurality of auxiliary bonding pads are located on the side of the encapsulation layer facing away from the substrate; and
the plurality of auxiliary bonding pads comprises a low potential bonding pad, and the electrostatic discharge portion is electrically connected with the low potential bonding pad.

8. The organic light emitting display panel according to claim 1, further comprising a polarizer located on a side of the touch layer facing away from the substrate, wherein
the electrostatic discharge portion comprises a first area, the electrostatic discharge portion in the first area does not overlap with the polarizer in the direction perpendicular to the substrate; the electrostatic discharge portion is electrically connected with the polarizer through silver adhesive, and the silver adhesive is in direct contact with the electrostatic discharge portion in the first area.

9. The organic light emitting display panel according to claim 1, wherein the electrostatic discharge portion comprises a plurality of hollowed-out portions, and the plurality of hollowed-out portions overlap with the packaging adhesive in the direction perpendicular to the substrate.

10. The organic light emitting display panel according to claim 1, wherein at least a part of a wire of the electrostatic discharge portion has a shape of polygonal line.

11. The organic light emitting display panel according to claim 1, wherein a first insulating layer is arranged between the electrostatic discharge portion and the auxiliary electrostatic discharge portion, the first insulating layer comprises a plurality of first via holes, and the electrostatic discharge portion and the auxiliary electrostatic discharge portion are electrically connected via the plurality of first via holes.

12. The organic light emitting display panel according to claim 1, wherein the electrostatic discharge portion covers a surface on a side of the auxiliary electrostatic discharge portion facing away from the substrate.

13. The organic light emitting display panel according to claim 1, wherein the electrostatic discharge portion is made of at least one of gold, silver, aluminum, copper, iron, platinum and titanium.

14. The organic light emitting display panel according to claim 1, wherein
the organic light emitting display panel is an irregular-shaped panel, the display area comprises at least one segment of irregular-shaped edge; and
the electrostatic discharge portion comprises a plurality of corners, and the plurality of corners each have a shape of rounded corner.

15. An organic light emitting display panel, comprising:
a display area, and a non-display area around the display area;
a substrate;
a driving device layer and a light emitting device layer arranged above the substrate, wherein the driving device layer and the light emitting device layer are located in the display area, the driving device layer comprises a plurality of thin film transistors, and the light emitting device layer comprises a plurality of organic light emitting diodes;
an encapsulation layer covering the light emitting device layer; and
a touch layer located on a side of the encapsulation layer facing away from the substrate, the touch layer comprising a touch electrode and a touch wire;
wherein the non-display area comprises an electrostatic discharge portion, the electrostatic discharge portion is made of a conductive material and is located on a side of the encapsulation layer facing away from the substrate;
the non-display area comprises a blocking portion, the blocking portion is arranged around the display area, and the blocking portion is located between the substrate and the encapsulation layer; and
the electrostatic discharge portion is located on a side of the touch wire facing away from the display area,
wherein the blocking portion comprises banks;
the encapsulation layer is a thin film encapsulation layer covering a surface on a side of the bank facing away from the substrate,
wherein the electrostatic discharge portion is made of a metal material, the electrostatic discharge portion is located between the touch wire and a panel crack detection wire of the organic light emitting display panel, and the electrostatic discharge portion partially overlaps with the banks.

16. The organic light emitting display panel according to claim 15, wherein the panel crack detection wire is located on a side of the banks facing away from the display area.

17. An organic light emitting display device, comprising an organic light emitting display panel according to claim 15.

18. An organic light emitting display device, comprising an organic light emitting display panel, wherein
the organic light emitting display panel comprises:
a display area, and a non-display area around the display area;
a substrate;
a driving device layer and a light emitting device layer arranged above the substrate, wherein the driving device layer and the light emitting device layer are located in the display area, the driving device layer comprises a plurality of thin film transistors, and the light emitting device layer comprises a plurality of organic light emitting diodes;
an encapsulation layer covering the light emitting device layer; and
a touch layer located on a side of the encapsulation layer facing away from the substrate, the touch layer comprising a touch electrode and a touch wire;
wherein the non-display area comprises an electrostatic discharge portion, the electrostatic discharge portion is made of a conductive material and is located on a side of the encapsulation layer facing away from the substrate;
the non-display area comprises a blocking portion, the blocking portion is arranged around the display area, and the blocking portion is located between the substrate and the encapsulation layer; and
the electrostatic discharge portion is located on a side of the touch wire facing away from the display area,
wherein the blocking portion comprises banks;
the encapsulation layer is a thin film encapsulation layer covering a surface on a side of the bank facing away from the substrate,
wherein the electrostatic discharge portion is made of a metal material, the electrostatic discharge portion is located between the touch wire and a panel crack detection wire of the organic light emitting display panel, and the electrostatic discharge portion does not overlap with the banks.

* * * * *